United States Patent
Thimsen et al.

(10) Patent No.: US 10,889,904 B2
(45) Date of Patent: Jan. 12, 2021

(54) SYNTHESIS OF NANOSTRUCTURED PHOTOACTIVE FILMS WITH CONTROLLED MORPHOLOGY BY A FLAME AEROSOL REACTOR

(71) Applicant: Washington University, St. Louis, MO (US)

(72) Inventors: Elijah James Thimsen, St. Louis, MO (US); Pratim Biswas, Chesterfield, MO (US)

(73) Assignee: Washington University, St. Louis, MO (US)

(*) Notice: Subject to any disclaimer, the term of this patent is extended or adjusted under 35 U.S.C. 154(b) by 0 days.

(21) Appl. No.: 14/966,356

(22) Filed: Dec. 11, 2015

(65) Prior Publication Data

US 2016/0160362 A1 Jun. 9, 2016

Related U.S. Application Data

(63) Continuation of application No. 12/675,941, filed as application No. PCT/US2008/074374 on Aug. 27, 2008, now abandoned.

(Continued)

(51) Int. Cl.
*C25B 1/04* (2006.01)
*C25B 9/06* (2006.01)
(Continued)

(52) U.S. Cl.
CPC .............. *C25B 9/06* (2013.01); *B01J 21/063* (2013.01); *B01J 35/06* (2013.01); *B82Y 30/00* (2013.01); *C25B 1/003* (2013.01); *C25B 1/04* (2013.01); *C25B 11/02* (2013.01); *H01G 9/2031* (2013.01); *H01L 31/032* (2013.01); *H01L 31/0324* (2013.01); *H01L 31/03529* (2013.01); *H01L 31/035281* (2013.01); *H01L 31/068* (2013.01); *B01J 37/349* (2013.01); *Y02E 10/542* (2013.01); *Y02E 60/36* (2013.01)

(58) Field of Classification Search
None
See application file for complete search history.

(56) References Cited

U.S. PATENT DOCUMENTS 5,652,021 A 7/1997 Hunt et al.
6,013,318 A 1/2000 Hunt et al.
(Continued)

FOREIGN PATENT DOCUMENTS

WO 9935312 A1 7/1999
WO 2006108425 A1 10/2004
WO 2009032654 A1 3/2009

OTHER PUBLICATIONS

Su (Journal of the Electrochemical Society, 151 (9) A1375-A1382 (2004)).*

(Continued)

*Primary Examiner* — Joel G Horning
(74) *Attorney, Agent, or Firm* — Armstrong Teasdale LLP

(57) ABSTRACT

An improved process for the preparation of nanostructured metal species-based films in a flame aerosol reactor is provided. The present invention also further provides improved nanostructured photo-watersplitting cells, improved dye sensitized solar cells and improved nanostructured p/n junction solar cells.

8 Claims, 43 Drawing Sheets

Related U.S. Application Data

(60) Provisional application No. 60/969,365, filed on Aug. 31, 2007.

(51) Int. Cl.

| | |
|---|---|
| C25B 1/00 | (2006.01) |
| H01G 9/20 | (2006.01) |
| H01L 31/0352 | (2006.01) |
| B01J 35/06 | (2006.01) |
| H01L 31/032 | (2006.01) |
| B01J 21/06 | (2006.01) |
| B82Y 30/00 | (2011.01) |
| C25B 11/02 | (2006.01) |
| H01L 31/068 | (2012.01) |
| B01J 37/34 | (2006.01) |

(56) References Cited

U.S. PATENT DOCUMENTS

| | | | |
|---|---|---|---|
| 6,113,983 | A | 9/2000 | Zachariah et al. |
| 6,193,911 | B1 | 2/2001 | Hunt et al. |
| 6,372,364 | B1 | 4/2002 | Hunt et al. |
| 6,777,374 | B2 | 8/2004 | Sahle-Demessie et al. |
| 7,033,637 | B1 | 4/2006 | Hunt et al. |
| 2002/0058143 | A1 | 5/2002 | Hunt et al. |
| 2004/0050207 | A1 | 3/2004 | Woodridge et al. |
| 2005/0016577 | A1 | 1/2005 | Andriessen et al. |
| 2006/0165910 | A1 | 7/2006 | Kodas et al. |
| 2006/0263922 | A1 | 11/2006 | Levitsky et al. |

OTHER PUBLICATIONS

Adachi et al., "Formation of Titania Nanotubes and Applications for Dye Sensitized Solar Cells", Journal of the Electrochemical Society, 2003, pp. G448-G493, vol. 150, No. 8.
Aduda et al., "Effect of morphology on electron drift mobility in porous TiO2", International Journal of Photoenergy, 2004, pp. 141-147, vol. 6.
Banerjee et al., "Recent developments in the emerging field of crystalline p-type transparent conducting oxide thin films", Progress in Crystal Growth and Characterization of Materials, 2005, pp. 52-105, vol. 50.
Beck et al., "The Dissociative Adsorption of Hydrogen-Sulfide over Nanophase Titanium-Dioxide", Journal of Materials Research 1992; pp. 2840-2845, vol. 7, No. 10.
Biswas et al., "Control of toxic metal emissions from combustors using sorbents: A review", Journal of the Air & Waste Management Association, 1998, pp. 113-127, vol. 48.
Biswas et al., "Speeding up production of material for solar energy applications", The International Society for Optical engineering, SPIE Newsroom, 2006, 2 pages.
Chen et al., "Thin-film techniques for advanced energy conversion and storage systems", Journal of Industrial and Engineering Chemistry, 2004, pp. 1114-1125, vol. 10, No. 7.
Cho et al., "Sintering rates for pristine and doped titanium dioxide determined using a tandem differential mobility analyzer system", Aerosol Science and Technology, 2006, pp. 309-319, vol. 40.
deJongh et al., "Trap-Limited Electronic Transport in Assemblies of Nanometer-Sized TiO2 Particles", Physical Review Letters, 1996, pp. 3427-3430, vol. 77.
Gratzel, "Photoelectrochemical Cells", Nature, 2001, pp. 338-344, vol. 414.
Gratzel, "Solar Energy Conversion by Dye-Sensitized Photovoltaic Cells", Inorganic Chemistry, 2005, pp. 6841-6851, vol. 44.
Greene et al., "Low Temperature Wafer Scale Prodution of ZNO Nanowier Arrays," Angew. Chem. Int. Ed., Dec. 2003, pp. 3031-3034, vol. 42, No. 31.
Herrmann, "Heterogeneous Photocatalysis: State of the Art and Present Applications", Topics in Catalysis, 2005, pp. 49-65, vol. 34, Nos. 1-4.

International Search Report and Written Opinion for PCT/US08/74374 dated Nov. 28, 2008; 8 pages.
Jiang et al., "Flame Synthesis of nanoparticles with rigorous control of their size, crystal structure and morphology for biological studies", Nanotechnology, 2007, pp. 1-8, vol. 18.
Kang et al., "Columnar Rutile TiO2 Base Dy Sensitized Solar Cells by Radio-Frequency Magnetron Sputtering," Journal of Power Sources, Jun. 2008, pp. 331-335, vol. 184, No. 20.
Kobata et al., "Growth and Transformation of TiO2 Crystallites in Aerosol Reactor", AIChE Journal, 1991, pp. 347-359, vol. 37, No. 3.
Krinke et al., "Deposition of aerosol nanoparticles on flat substrate surfaces", Phase Transitions, 2003, pp. 333-345, vol. 76, Nos. 4-5.
Kulkarni et al., "Morphology of Nanostructured Films for Environmental Applications: Simulation of Simultaneous Sintering and Growth" Journal of Nanoparticle Research, 2003, pp. 259-268, vol. 5.
Kulkarni et al., "A Brownian dynamics simulation to predict morphology of nanoparticle deposits in the presence of interparticle interactions", Aerosol Science and Technology, 2004, pp. 541-554, vol. 38.
Law et al., "Nanowire Dy Sensitized Solar Cells," Nature Materials, Jun. 2005, pp. 455-459, vol. 4, No. 30.
Limmer et al., "A Study on the Growth of TiO2 Nanorods using Sol Electrophoresis", Journal of Materials Science, 2004, pp. 895-901, vol. 39.
Madler et al., "Direct Formation of Highly Porous Gas-Sensing Films by in-situ Thermophoretic Deposition of Flame-Made Pt/SnO2 Nanoparticles" Sensors and Actuators B, 2006; pp. 283-295, vol. 114.
Madler et al., "One-step aerosol synthesis of nanoparticle agglomerate films: simulation of film porosity and thickness", Nanotechnology, 2006, pp. 4783-4795, vol. 17.
Mangolini et al., "High-Yield Plasma Synthesis of Luminescent Silicon Nanocrystals", Nanoletters, 2005, pp. 655-659, vol. 5, No. 4.
Nakaso et al., "Size distribution change of titania nano-particle agglomerates generated by gas phase reaction, agglomeration, and sintering", Aerosol Science and Technology, 2001, pp. 929-947, vol. 35.
Namiki et al., "Tubular reactor synthesis of doped nanostructured titanium dioxide and its enhanced activation by coronas and soft X-rays", Industrial & Engineering Chemistry Research, 2005, pp. 5213-5220, vol. 44.
Nanu et al., "Nanocomposite three-dimensional solar cells obtained by chemical spray deposition", Nano Letters, 2005, pp. 1716-1719, vol. 5, No. 9.
Nowotny et al., "Solar-hydrogen: environmentally safe fuel for the future", International Journal of Hydrogen Energy, 2005, pp. 521-544, vol. 30.
O'Hayre et al., "The Influence of TiO2 Particle Size in TiO2/CuInS Nanocomposite Solar Cells", Advanced Functional Materials, 2006, pp. 1566-1576, vol. 16.
Okuyama et al., "Production of Ultrafine Metal Oxide Aerosol Particles by Thermal Decomposition of Metal Alkoxide Vapors", AIChE Journal, 1986, pp. 2010-2019, vol. 32, No. 12.
Palgrave et al., "Aerosol Assisted Chemical Vapor Deposition using Nanoparticle Precursors: A Route to Nanocomposite Thin Films", Journal of the American Chemical Society, 2006, pp. 1587-1597, vol. 128.
Paulose et al., "Andoic growth of highly ordered TiO2 nanotube arrays to 134 mu m in length", Journal of Phys Chem B, 2006, pp. 16179-16184, vol. 110.
Peiro et al., "Hybrid Polymer/Metal Oxide Solar Cells Based on ZnO Columnar Structures," Journal of Materials Chemistry, Apr. 4, 2006, pp. 2088-2096, vol. 16.
Sahle-Demessie et al., "Synthesizing Alcohols and Ketones by Photoinduced Catalytic Partial Oxidation of Hydrocarbons in Titania Film Reactors Prepared by Three Different Methods", 1999, Industrial & Engineering Chemistry Research, pp. 3276-3284, vol. 38.
Thimsen et al., "Nanostructured Photoactive Films Synthesized by a Flam Aerosol Reactor", Journal of American Institute of Chemical Engineers, 2007, pp. 1727-1735, vol. 53, No. 7.

(56) References Cited

OTHER PUBLICATIONS

Varghese et al., "Water-Photolysis Properties of Micron-Length Highly-Ordered Titania Nanotube-Arrays", Journal of Nanoscience and Nantechnology, 2005, pp. 1158-1165, vol. 5.

Wu et al., "Capture of mercury in combustion systems by in situ-generated titania particles with UV irradiation", Environmental Engineering Science, 1998, pp. 137-148, vol. 15, No. 2.

Yang et al. "Deposition of Multifunctional Titania Films by Aerosol Routes", Journalof the American Ceramic Society, 1999, pp. 2573-2579, vol. 82, No. 10.

Zhu et al., "Enhanced charge-collection efficiencies and light scattering in dye-sensitized solar cells using oriented TiO2 nanotubes arrays", Nano Letters, 2007, pp. 69-74, vol. 7, No. 1.

\* cited by examiner

SYNTHESIS OF NANOSTRUCTURED PHOTOACTIVE FILMS WITH CONTROLLED MORPHOLOGY BY A FLAME AEROSOL REACTOR

CROSS-REFERENCE TO RELATED APPLICATIONS

This application is a continuation application of U.S. patent application Ser. No. 12/675,941, filed Aug. 23, 2010, which is a U.S. National Phase Patent Application of International Application Serial Number PCT/US2008/074374, filed Aug. 27, 2008, which claims priority benefit of U.S. Provisional Patent Application Ser. No. 60/969,365, filed on Aug. 31, 2007, the entire contents of which are all incorporated herein by reference.

FIELD OF THE INVENTION

The present invention generally relates to a single step process for the preparation of photoactive films using a flame aerosol reactor. The present invention also generally relates to films having morphology resulting in high solar conversion efficiencies.

BACKGROUND OF THE INVENTION

In recent years, solar cells for the conversion of photons into electric energy have drawn attention as an alternative energy source in response to concerns about environmental problems and energy depletion associated with fossil fuels.

One of the major obstacles to widespread harvesting of solar energy is the high production cost of silicon-based solar cells. Low cost alternatives include dye-sensitized solar ("DSS") cells and photocatalytic water-splitting ("PWS") cells. Both types of cells use a photoelectrical process comprising a photocatalyst, typically immobilized as a film, to covert solar energy into a more usable form. DSS cells generate an electric current and PWS cells generate hydrogen gas.

Photovoltaic film fabrication has been an active area of research for several decades and a number of methods have been developed. Two methods, chemical vapor deposition ("CVD") and combustion chemical vapor deposition ("CCVD"), produce vaporized metal species that condense on a substrate to form nanoparticles. Problematically, CVD and CCVD generally involve multi-step processes, such as deposition followed by sintering, that can take from several hours to days to complete, and metal species particle size and nanostructured morphology are difficult to control. Those methods are not well suited to the inexpensive industrial scaleup that would be required for widespread implementation.

A need exists for low cost methods for the preparation of nanostructured films having high surface area and having tailored morphological characteristics suitable for applications in catalytic reactors and photovoltaic films.

SUMMARY OF THE INVENTION

Among the various aspects of the present invention is the provision of an improved process for the preparation of metal species-based nanostructured films in a flame aerosol reactor, improved nanostructured photo-watersplitting cells, improved dye sensitized solar cells and improved nanostructured p/n junction solar cells.

Briefly, therefore one aspect of the present invention is a process for the preparation of a metal species-based nanostructured film in a flame aerosol reactor. The method comprises introducing a vaporized metal precursor stream, a vaporized fuel stream and a vaporized oxidizer stream and combusting the streams in a flame to form metal species-based nanoparticles in the flame region. The metal species-based nanoparticles are deposited onto a support surface wherein the temperature of the surface is controlled. The metal species-based nanoparticles are sintered to form the metal species-based nanostructured film.

The present invention is further directed to a process for the preparation of a metal species-based nanostructured film in a flame aerosol reactor. The method comprises introducing a vaporized metal precursor stream and a vaporized fuel stream into the reactor and combusting the streams in a flame to form in the flame region metal species-based nanoparticles comprising zero valent metal. The metal species-based nanoparticles are deposited onto a support surface wherein the temperature of the surface is controlled. The metal species-based nanoparticles are sintered to form the metal species-based nanostructured film.

The present invention is further directed to a nanostructured photo-watersplitting cell for the production of hydrogen. The cell comprises a photoanode comprising a support and a nanostructured metal oxide film disposed on at least one surface of the support. The film predominantly comprises a columnar morphology characterized as having continuous individual columnar structures oriented approximately normal to the support wherein the columnar structures have an average width, w, and a grain size criterion, $X_s$, and wherein w/10 is greater than $X_s$. The cell further comprises a counter electrode. The nanostructured photo-water splitting cell has a sunlight to hydrogen conversion efficiency of from about 10% to about 15%.

The present invention is further directed to a nanostructured dye-sensitized solar cell comprising an electron conducting layer comprising a support and a nanostructured metal oxide film disposed on at least one surface of the support. The film predominantly comprises a columnar morphology characterized as having continuous individual columnar structures oriented approximately normal to the support wherein the columnar structures have an average width, w, and a grain size criterion, $X_s$, and wherein w/10 is greater than $X_s$. The cell further comprises a light absorbing layer and a hole-conducting layer. The nanostructured dye-sensitized solar cell has a sunlight to electricity conversion efficiency of from about 10% to about 20%.

The present invention is further directed to a nanostructured p/n junction solar cell comprising an n-type oxide semiconductor layer comprising a support and a nanostructured metal oxide film disposed on at least one surface of the support, the film predominantly comprising a columnar morphology characterized as having continuous individual columnar structures oriented approximately normal to the support wherein the columnar structures have an average width, w, and a grain size criterion, $X_s$, and wherein w/10 is greater than $X_s$. The cell further comprises a p-type oxide semiconductor layer comprising a support and a nanostructured metal oxide film disposed on at least one surface of the support, the film predominantly comprising a columnar morphology characterized as having continuous individual columnar structures oriented approximately normal to the support wherein the columnar structures have an average width, w, and a grain size criterion, $X_s$, and wherein w/10 is greater than $X_s$. The nanostructured p/n junction solar cell has a sunlight to electricity conversion of from about 10% to about 20%.

Other objects and features will be in part apparent and in part pointed out hereinafter.

BRIEF DESCRIPTION OF THE DRAWINGS

FIG. 4A is a schematic illustration of columnar morphology formation on high temperature glass substrate, FIG. 4B is a scanning electron micrograph image of a side view of titanium dioxide films having columnar morphology, FIG. 4C is a scanning electron micrograph image of a highly crystalline titanium dioxide single column, and FIG. 4D a is transmission electron microscopy image for columnar titanium dioxide showing diffraction from the [103] and [101] planes of anatase.

FIG. 9A is a schematic illustration of granular morphology formation on low temperature glass substrate, FIG. 9B is a scanning electron micrograph of a side view of titanium dioxide films having granular morphology, FIG. 9C is a transmission electron microscopy image of a granular titanium dioxide fractal, and FIG. 9D is an image of titanium dioxide polycrystalline electron diffraction rings corresponding to the [101], [004], [200], [105] and [205] reflections of anatase, moving from the center of the ring outwards.

FIG. 15A is a transmission electron microscopy image of titanium dioxide particles in a flame aerosol reactor of the present invention having an aerosol phase prepared at a titanium isopropoxide metal precursor feed rate of 0.069 millimols per hour, FIG. 15B is an illustration of the titanium dioxide particle size distribution from transmission electron microscopy images, and FIG. 15C is a titanium dioxide aerosol phase particle size distribution measured by scanning mobility particle spectrometry (SMPS). $D_p$ refers to the average particle size.

FIG. 16A is a transmission electron microscopy image of titanium dioxide particles in a flame aerosol reactor of the present invention aerosol phase prepared at a titanium isopropoxide metal precursor feed rate of 0.55 millimols per hour, FIG. 16B is an illustration of the titanium dioxide particle size distribution from transmission electron microscopy images, and FIG. 16C is a titanium dioxide aerosol phase particle size distribution measured by scanning mobility particle spectrometry (SMPS). $D_p$ refers to the average particle size.

FIG. 17A is a scanning electron micrograph side view image of titanium dioxide prepared in a flame aerosol reactor of the present invention at a titanium isopropoxide metal precursor feed rate of 0.069 millimols per hour for 180 seconds and imaged at high resolution, and FIG. 17B is a scanning electron micrograph side view image of titanium dioxide prepared at an titanium isopropoxide metal precursor feed rate of 0.55 millimols per hour for 180 seconds and imaged at low resolution (b1) and at an isopropoxide metal precursor feed rate of 0.55 millimols per hour for 180 seconds and imaged at high resolution (b2).

Corresponding reference characters indicate corresponding parts throughout the drawings.

DESCRIPTION OF THE PREFERRED EMBODIMENTS

The present invention is directed to a controlled, single step, flame aerosol reaction process for the preparation of photovoltaic films comprising a photocatalyst. The present invention is further directed to photovoltaic films having high efficiency for the conversion by the photocatalyst of ultraviolet ("UV") light into electrical current and hydrogen by watersplitting.

In accordance with the present invention, it has been discovered that gaseous metal precursor, fuel and an oxidizer can be combusted in a flame aerosol reactor to generate metal species-based nanoparticles in an aerosol phase in the flame region, the nanoparticles then being deposited onto a temperature controlled substrate via thermophoresis to yield nanoparticle films of desired morphology. The present mechanism is different from CVD and CCVD processes known in the art where nanoparticles instead form on the substrate from a vapor phase. It has further been discovered that the size of the particles as they arrive at the substrate can be controlled by varying the metal precursor feed rate. It has still further been discovered that substrate temperature can control the nanoparticle sintering rate and the resultant crystal phase of the film. Nanoparticle deposition and sintering can be done simultaneously thereby providing a single step film fabrication process.

In accordance with the present invention, it has been further discovered that the nanoparticles of the present invention can be used in the preparation of nanostructured photo-water splitting cells for the production of hydrogen, the cells having a sunlight to hydrogen conversion efficiency of from about 10% to about 15%; in the preparation of nanostructured dye-sensitized solar cells having a sunlight to electricity conversion efficiency of from about 10% to about 20%; and in the preparation of nanostructured p/n junction solar cells having a sunlight to electricity conversion efficiency of from about 10% to about 20%.

Flame aerosol reactors ("FLAR") in combination with a cooled substrate is an effective way to synthesize metal species-based nanostructured films in single-step processes that allow rapid processing. Through the control of process variables such as, for example, formed nanoparticle particle size and substrate temperature, FLAR can be used to tailor film architecture and morphology to meet the needs of specific applications. The controlled morphology of nanoparticle films produced in the FLAR can generally take on two forms, granular and columnar.

Figure 1:
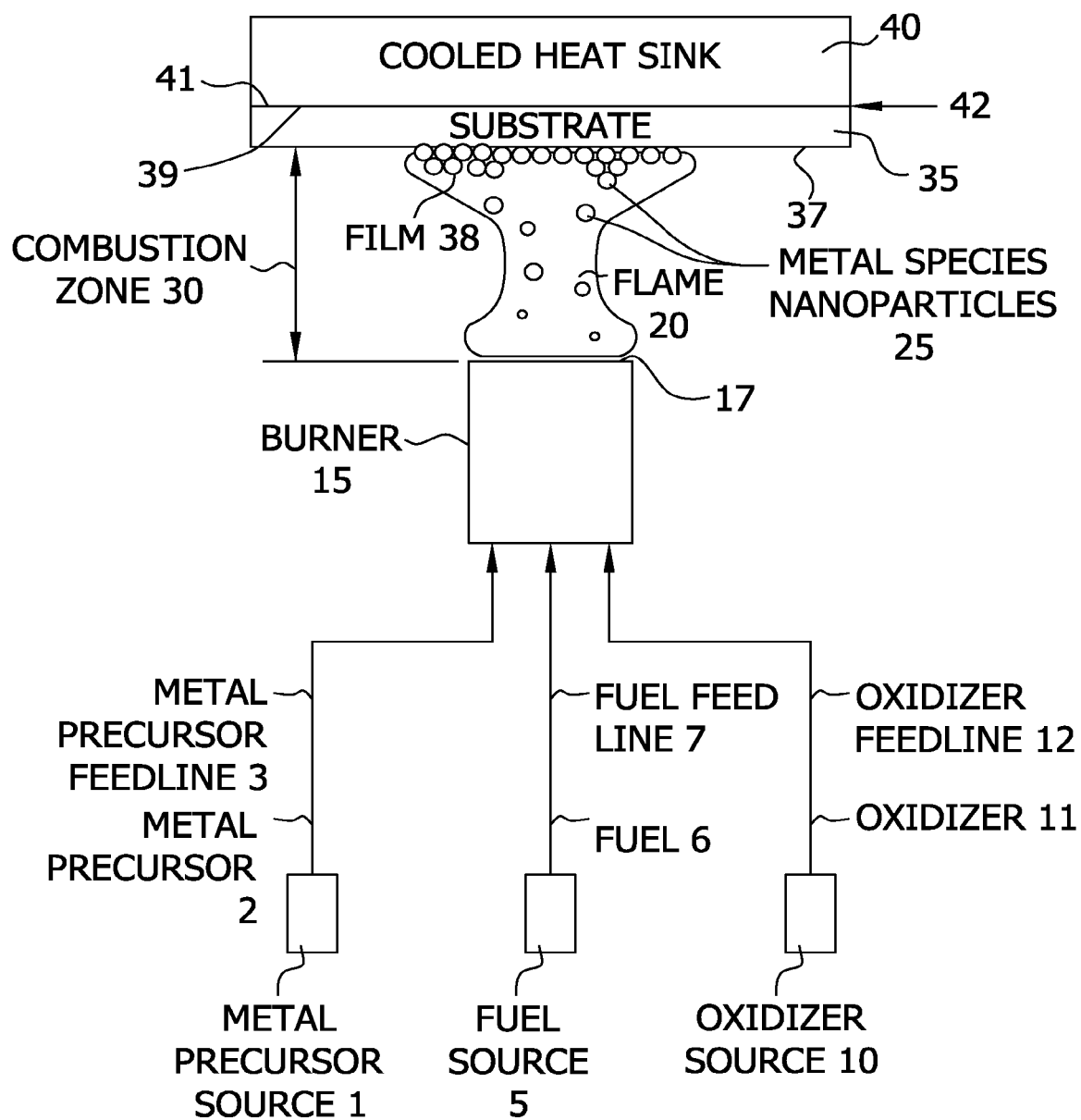
FIG. 1 is a schematic illustration of a flame aerosol reactor of the present invention.

FIG. 1 illustrates an example of one FLAR embodiment of the present invention. The FLAR comprises a metal precursor feed line 3 for supplying a metal precursor stream 2 from a source 1 to the burner 15, a fuel feed line 7 for supplying a fuel stream 6 from a source 5 to the burner 15 and an oxidizer feed line 12 for supplying an oxidizer stream 11 from a source 10 to the burner 15. Vaporized fuel and vaporized oxidizer are combusted in the burner 15 to form a flame 20 in the combustion zone 30 located between the distal end of the burner 17 and the exposed surface 37 of the substrate 35. One surface 39 of the substrate 35 is in direct or indirect contact with a surface 41 of cooled heat sink 40 for control of the temperature of substrate surface 37. Metal species-based nanoparticles 25 form in the combustion zone 30 and are deposited as a film 38 on substrate surface 37. In one embodiment, one or more thermal resistance devices 42 can be inserted between substrate surface 39 and cooled heat sink surface 41.

In one embodiment, burner 15 can comprise one or a plurality (not depicted) of metal precursor feed lines 3, fuel feed lines 7 and/or oxidizer feed lines 12. In another embodiment, the fuel 6 and oxidizer 11 can be optionally admixed and introduced to burner 15 as an admixture through one or a plurality of feed lines (not depicted). In another embodiment, the metal precursor 2 and fuel 6 can be optionally admixed and introduced to burner 15 as an admixture through one or a plurality of feed lines (not depicted). In another embodiment, the metal precursor 2 and oxidizer 11 can be optionally admixed and introduced to burner 15 as an admixture through one or a plurality of feed lines (not depicted). In another embodiment, the metal precursor 2, fuel 6 and oxidizer 11 can be optionally admixed and introduced to burner 15 as an admixture through one or a plurality of feed lines (not depicted). In yet another non-depicted embodiment, an inert gas can be added to the metal precursor stream 2 as a carrier or dilution gas, to the fuel stream 6 as a carrier or dilution gas, to the oxidizer stream 11 as a carrier or dilution gas, and/or to the burner 15 as a dilution gas. In still another non-depicted embodiment, a flow control device, such as a control valve, can be place in the metal precursor feed line(s) 3, fuel feed line(s) 7 and/or oxidizer feed line(s) 12 to regulate the flow of the metal precursor stream(s) 2, the fuel stream(s) 6 and/or oxidizer stream(s) 11 to the burner 15.

Preferred metal precursors include essentially any metal compound that can be volatilized and oxidized, nitrided, hydrolyzed, or otherwise reacted in a high temperature flame environment. Examples of volatile metal compounds non-exclusively include metal alkyls, metal olefin complexes, metal hydrides, metal halides, metal alkoxides, metal oxides, metal formates, acetates, oxalates, and esters generally, metal glycolates, metal glycolato alkoxides, complexes of metals with hydroxyalkyl amines, etc. Examples of typical metal precursors include titanium isopropoxide ("TTIP"), ferrocene and iron pentacarbonyl. All such compounds useful in the present process are termed "metal precursors." "Volatile metal compounds are defined as solid or liquid compounds capable of passing into the vapor state at a temperature within the scope of the present invention. In one embodiment, the volatile metal compounds are heated and pass into a carrier gas stream for delivery to the burner. The carrier gas can be an inert gas, a fuel gas (described below), an oxidizer gas (described below) or combinations thereof. Heat can be supplied to the volatile metal compounds indirectly such as by heating the container in which it is stored or by heating a recirculating slip stream, or directly such as by heating the carrier gas and passing it over or bubbling it through the volatile metal compound.

Preferred metals are those of the main groups 3 to 5 of the periodic table of the elements, the transition metals, and the "inner transition metals," i.e. lanthanides and actinides. "Metals" as used herein includes those commonly referred to as semi-metals, including but not limited to boron, germanium, silicon, arsenic, tellurium, etc. Metals of Groups 1 and 2 may also be used, generally in conjunction with a further metal from one of the aforementioned groups. Non-metal compounds such as those of phosphorous may also be used when a metal is used, e.g. to prepare mixed oxides or as dopants. In many cases, a predominant metal compound such as a tin or silicon compound is used, in conjunction with less than about 10 mol percent of another metal, such as a transition or inner-transition metal, to provide doped particles with unusual optical, magnetic, or electrical properties. Some preferred metals include silicon, titanium, zirconium, aluminum, gold, silver, platinum and tin.

Metal species-based nanoparticles generated in the FLAR from metal precursor compounds may be a zero valent metal, an oxide or hydroxide thereof, a carbide, boride, phosphide, nitride or other species, or mixture thereof. Preferred metal species are zero valent metals, metal oxides, or metal nitrides, more preferably zero valent metals and/or metal oxides. Representative metal compounds useful as photocatalysts of the present invention include anatase, rutile or amorphous metal oxides such as titanium dioxide ($TiO_2$) zinc oxide (ZnO), tungsten trioxide ($WO_3$), ruthenium dioxide ($RuO_2$), silicon oxide (SiO), silicon dioxide ($SiO_2$), iridium dioxide ($IrO_2$), tin dioxide ($SnO_2$), strontium titanate ($SrTiO_3$), barium titanate ($BaTiO_3$), tantalum oxide ($Ta_2O_5$), calcium titanate ($CaTiO_3$), iron (III) oxide ($Fe_2O_3$), molybdenum trioxide ($MoO_3$), niobium pentoxide ($NbO_5$), indium trioxide ($In_2O_3$), cadmium oxide (CdO), hafnium oxide ($HfO_2$), zirconium oxide ($ZrO_2$), manganese dioxide ($MnO_2$), copper oxide ($Cu_2O$), vanadium pentoxide ($V2O_5$), chromium trioxide ($CrO_3$), yttrium trioxide ($YO_3$), silver oxide ($Ag_2O$), or $Ti_xZr_{1-x}O_2$ wherein x is between 0 and 1; metal sulfides such as cadmium sulfide (CdS), zinc sulfide (ZnS), indium sulfide ($In_2S_3$), copper sulfide ($Cu_2S$), tungsten disulfide ($WS_2$), bismuth trisulfide ($BiS_3$), or zinc cadmium disulfide ($ZnCdS_2$); metal chalcogenites such as zinc selenide (ZnSe), cadmium selenide (CdSe), indium selenide ($In_2Se_3$), tungsten selenide ($WSe_3$), or cadmium telluride (CdTe); metal nitrides such as silicon nitride (SiN, $Si_3N_4$) and gallium nitride (GaN); metal phosphides such as indium phosphide (InP); metal arsenides such as gallium arsenide (GaAs); semiconductors such as silicon (Si), silicon carbide (SiC), diamond, germanium (Ge), germanium dioxide ($GeO_2$) and germanium telluride (GeTe); photoactive homopolyanions such as $W_{10}O_{32}^{-4}$; photoactive heteropolyions such as $XM_{12}O_{40}^{-n}$ or $X_2M_{18}O_{62}^{-7}$ wherein x is Bi, Si, Ge, P or As, M is Mo or W, and n is an integer from 1 to 12; polymeric semiconductors such as polyacetylene; and mixtures thereof. Transition metal oxides such as titanium dioxide and zinc oxide are preferred because they are chemically stable, non-toxic, inexpensive and exhibit high photocatalytic activity.

The fuel is any material which can be vaporized and oxidized under the flame conditions. Fuels include, without limitation, hydrogen; hydrocarbons such as methane, ethane, ethene, propane, propene and acetylene; hydrocarbonoxy compounds such as lower alcohols, ketones, etc.; and sodium. Combinations of gases, particularly combinations of hydrogen and lower alkanes may be useful in many applications. Sodium is useful when films comprising non-oxidized metal species-based nanoparticles (e.g., zero valent metals) are required. A molar excess of fuel gas to metal precursor compound is preferred, for example a molar ratio range of about 100:1 to about 100,000:1, about 1000:1 to about 50,000:1 or even about 1,000:1 to about 20,000:1.

Typical oxidizers suitable for the practice of the present invention include, without limitation, air, ozone, oxygen, fluorine, sulfur, chlorine, bromine and iodine. Oxygen is preferred when films comprising oxidized metal nanoparticles are required. In some embodiments, mixtures of gases can be used, for example, chlorine, fluorine or ozone in combination with oxygen or air. In general, a stoichiometric excess of oxidizer to fuel is preferred with a ratio of about 1.1:1 to about 2:1 preferred.

In general, the substrate (also termed support) can be any material that will not melt and will maintain structural integrity at the metal species-based nanoparticle deposition temperature used in the process. Suitable substrates include without limitation silica fibers, silicon, quartz, stainless steel, steel, glass, aluminum, ceramic and ceramic fibers. The substrates can be optionally coated prior to metal species deposition. Examples of substrates include, without limitation, polished silicon and aluminosilicate glass coated with indium tin oxide.

Combustion takes place in a single or multi-element diffusion flame burner.

In one embodiment, the burner comprises an array of closely spaced passages for introduction of fuel gas, oxidizer gas and vaporized metal precursor. In a typical arrangement, the passages are separated only by passage walls that are of sufficient thickness to maintain the mechanical integrity of the burner in view of the flame temperature. The burner passages preferably have regular geometric cross-sections, for example circular, triangular, square, hexagonal, etc. In one embodiment, the fuel gas passages can be manifolded together as are the oxidizing gas passages and metal precursor passages. In another embodiment, the manifolded passageways are in a plurality of groups. In yet another embodiment the passageways are individually supplied. In large devices, it may be preferable to provide for a multiplicity of burner arrays which can be stacked parallel to each other to provide a large burner surface. In another embodiment, the fuel gas and oxidizer gas passageways can be configured in a regular array across the surface of the burner such that fuel gas passageways are surrounded by oxidizer gas passageways, or oxidizer gas passageways are surrounded by fuel gas passageways. The spacing of the metal precursor feeds is also, in general, geometrically repetitive.

The surface of the burner is preferably substantially planar. In the case of smaller burners (e.g., those with less than about 25 cm² of surface area) having an array of feed lines, the flame temperature profile may decrease in temperature near the edges of the burner. In those areas, it may be desirable to raise the height of the passageways above the plane of those in the middle of the device to achieve a more one-directional temperature profile. Thus, in cross-section, the surface may be somewhat of a shallow elliptical, parabolic, hyperbolic, or other shape, with passageways in the middle of the device having a lower elevation than those near the edges.

In embodiments where single fuel gas, oxidizer gas and vaporized metal precursor lines are used, the burner can comprise a series of concentric tubes having an arrangement where a first, innermost tube is used for the introduction of the fuel gas, oxidizer gas, metal precursor, an optional inert gas, or mixtures thereof; a second tube, annular and concentric to the first tube, for the introduction of the fuel gas, oxidizer gas, metal precursor, an optional inert gas, or mixtures thereof; and a third tube annular and concentric to the second tube for the introduction of introduction of the fuel gas, oxidizer gas, metal precursor, an optional inert gas, or mixtures thereof, wherein at least one fuel gas, one oxidizer gas and one metal precursor are introduced.

In one embodiment, the fuel gas, oxidizer gas and metal precursor are introduced to the burner unmixed. In this embodiment, the metal precursor is preferably introduced with an inert carrier gas. Inert gases include, for example, helium, argon and nitrogen.

In another embodiment, the metal precursor may be mixed with either or both of the fuel gas and the oxidizer gas in order to maximize stoichiometric homogeneity to yield uniform nanoparticles. For zero valent or low valent oxidation states, the metal precursor can be mixed with the fuel gas. For higher oxidation states, the metal precursor can be mixed with the oxidizing gas. Mixing may be accomplished by vaporizing the metal precursor into a fuel gas or oxidizer gas carrier stream or by combining a vaporized metal gas stream with a fuel gas or oxidizer gas stream.

In the process of the present invention, metal species-based nanoparticles are formed in a FLAR by thermal reaction. When an oxidizing gas is present, metal oxide nanoparticles are formed by thermal oxidation. In the absence of an oxidizing gas, such as when the fuel is sodium, zero valence metal nanoparticles can be formed. The metal species-based nanoparticles are then deposited from the hot flame region onto a cooled substrate as a film via thermophoresis. The films typically exhibit two morphologies. The first is a well sintered columnar structure. The second is a particulate morphology caked onto the substrate.

Figure 2:
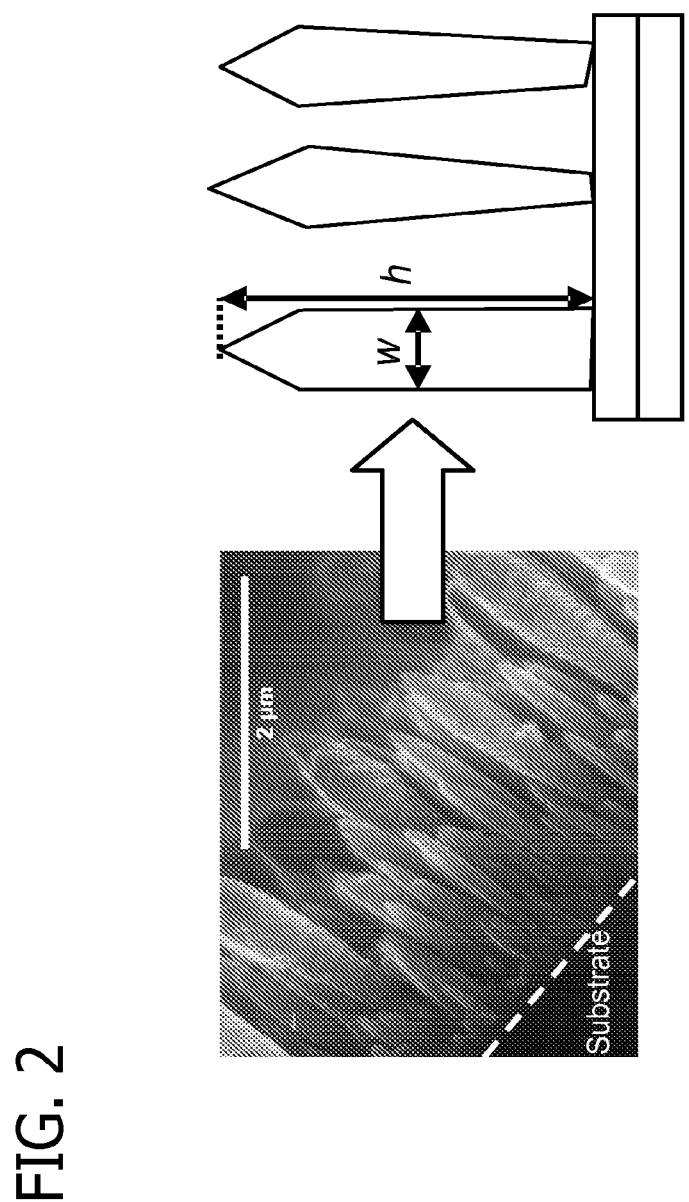
FIG. 2 is a scanning electron micrograph of a titanium dioxide film having a sintered column morphology and an illustration of typical columns where "w" is column width and "h" is column height.
Figure 3:
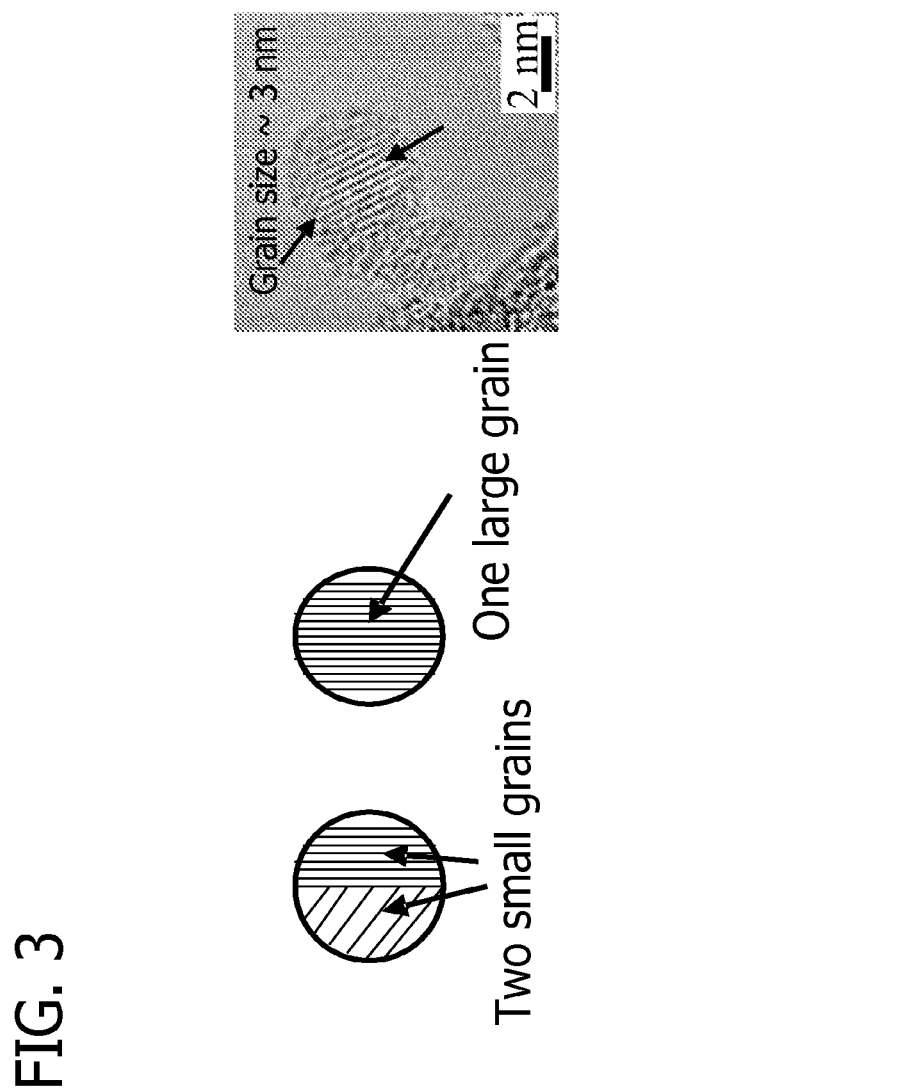
FIG. 3 is an illustration of grain size and a transmission electron microscopy image indicating the measurement of the grain size of a titanium dioxide particle of the present invention.
Figure 4A:
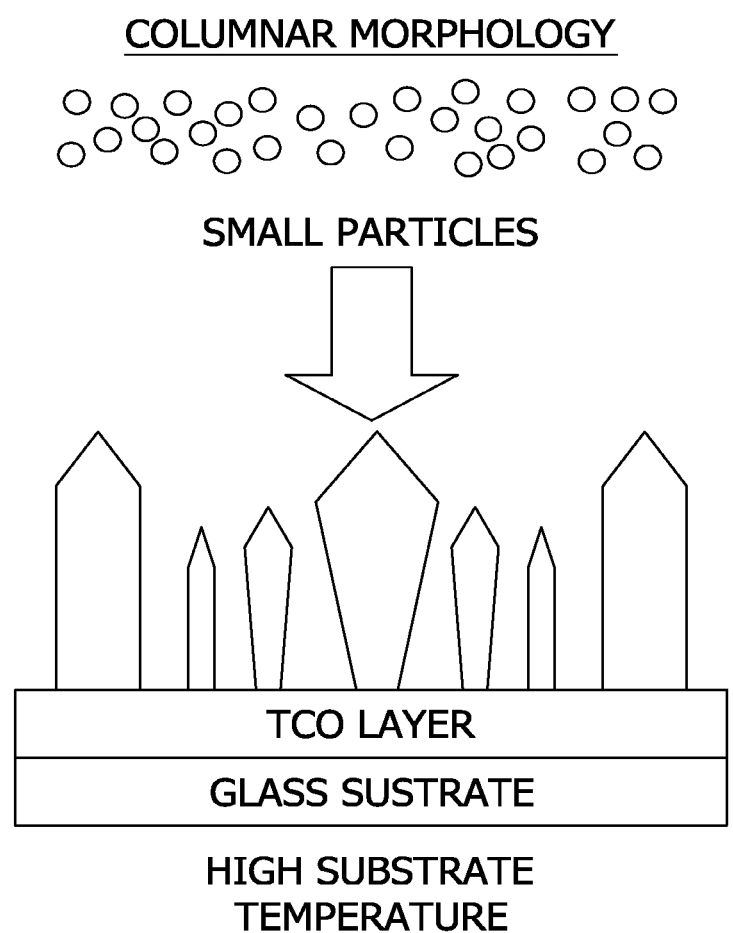
FIGS. 4A-4D depict a series of related films prepared by the flame aerosol reactor of the present invention where
Figure 4B:
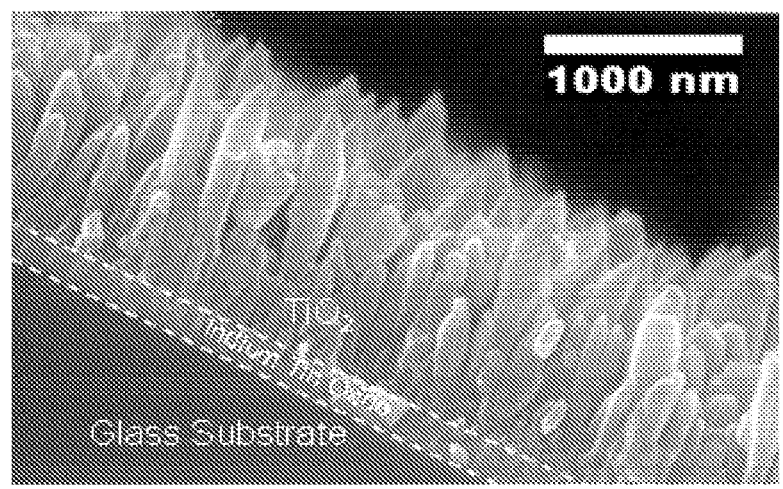
Figure 4C:
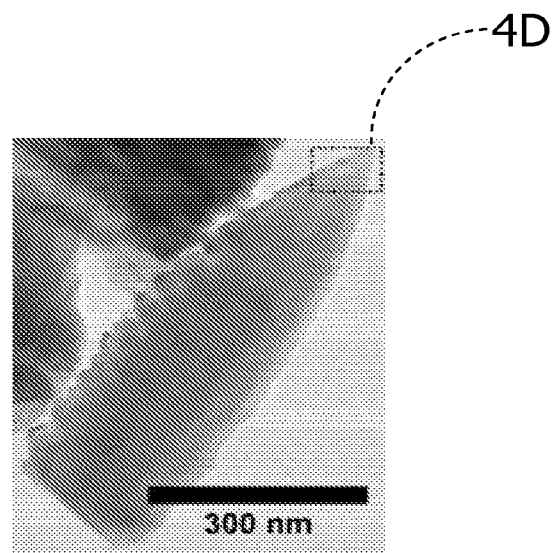
Figure 4D:
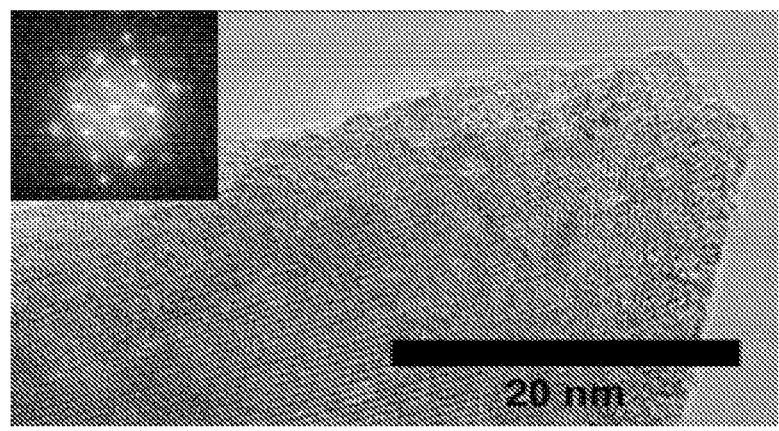
Figure 5:
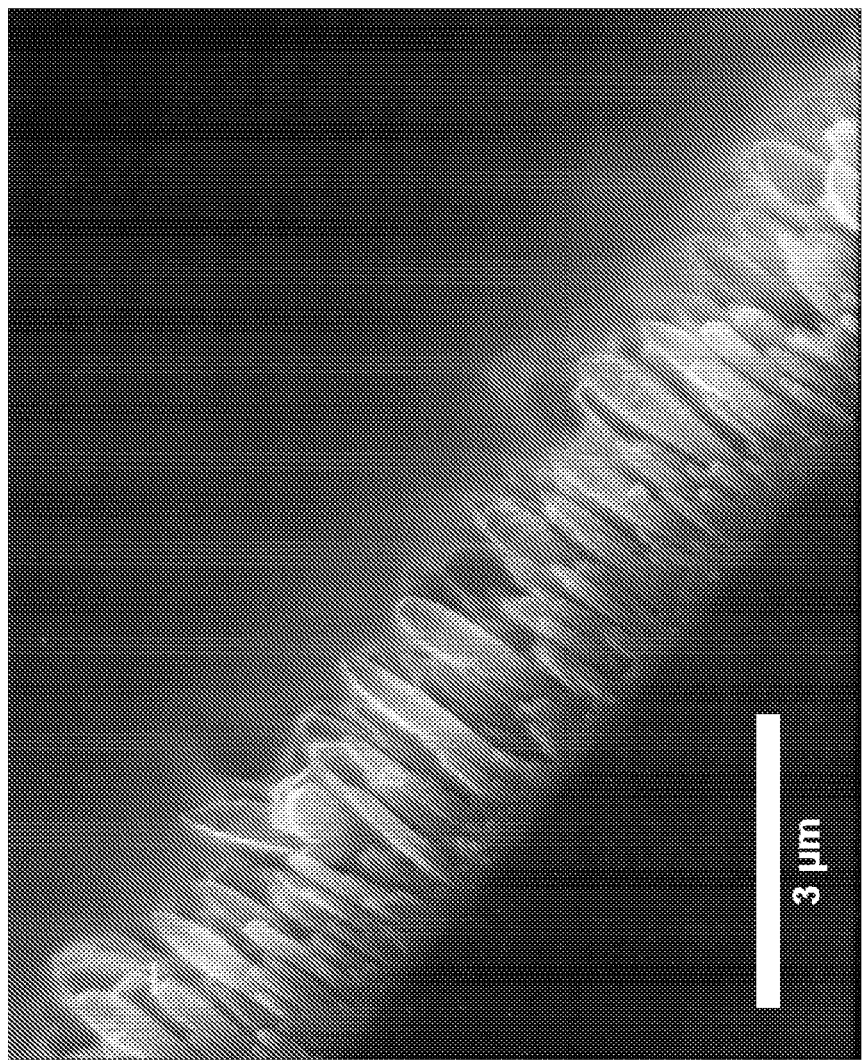
FIG. 5 is a scanning electron micrograph of a side view of a titanium dioxide film of the present invention having columnar morphology.
Figure 6:
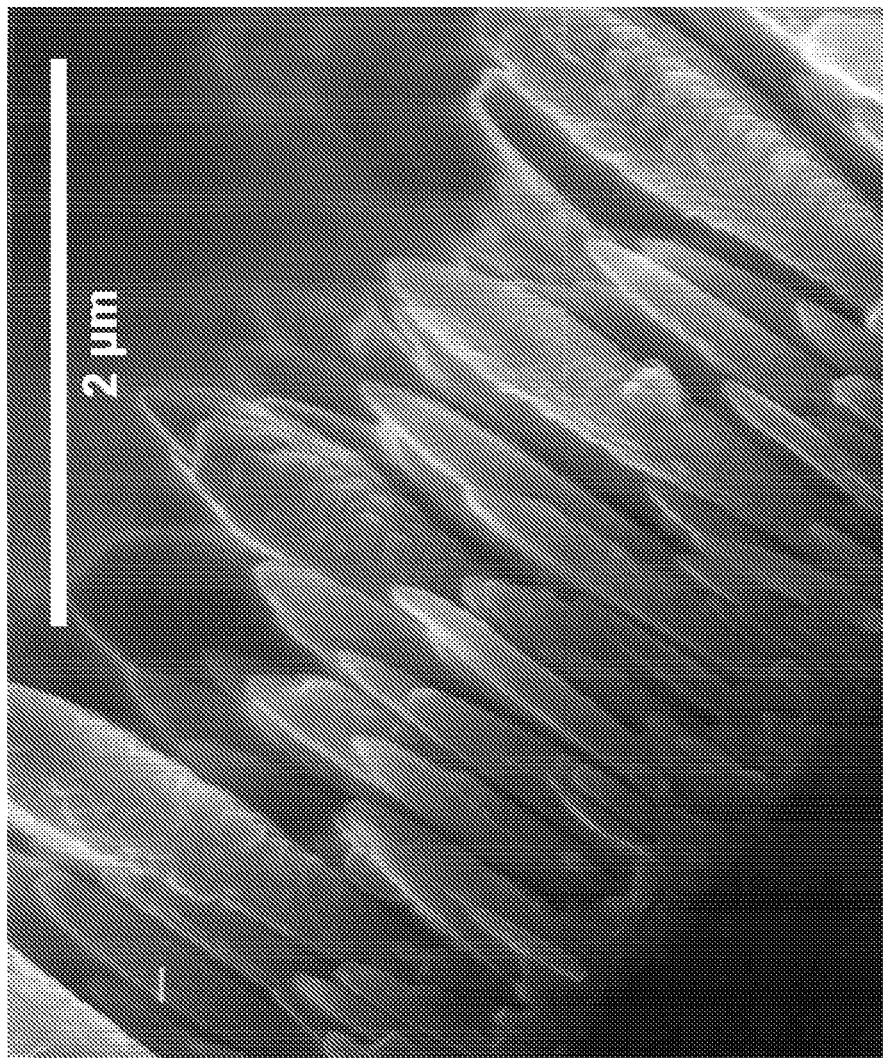
FIG. 6 is a scanning electron micrograph of a side view of a titanium dioxide film of the present invention having columnar morphology.
Figure 7:
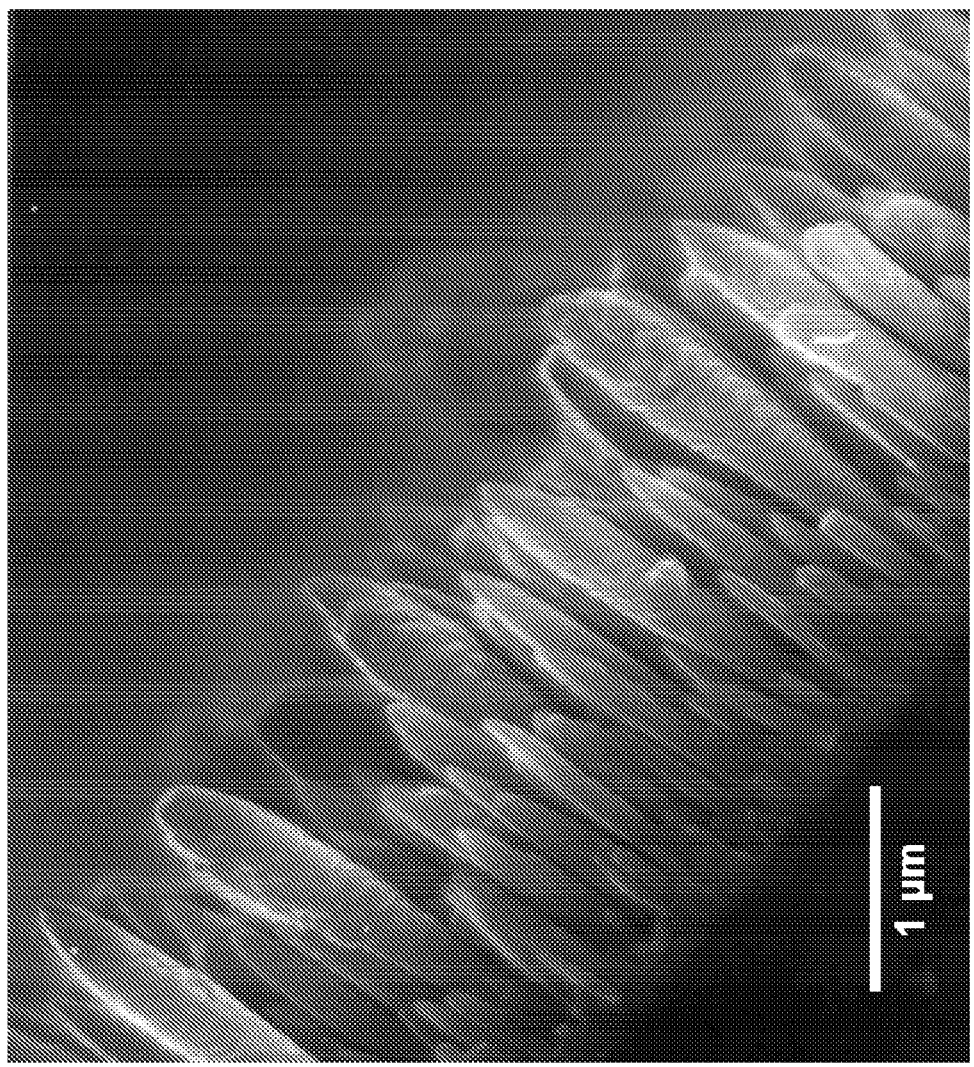
FIG. 7 is a scanning electron micrograph of a side view of a titanium dioxide film of the present invention having columnar morphology.
Figure 8:
FIG. 8 is a scanning electron micrograph of a side view of a titanium dioxide film of the present invention having columnar morphology.
Figure 9A:
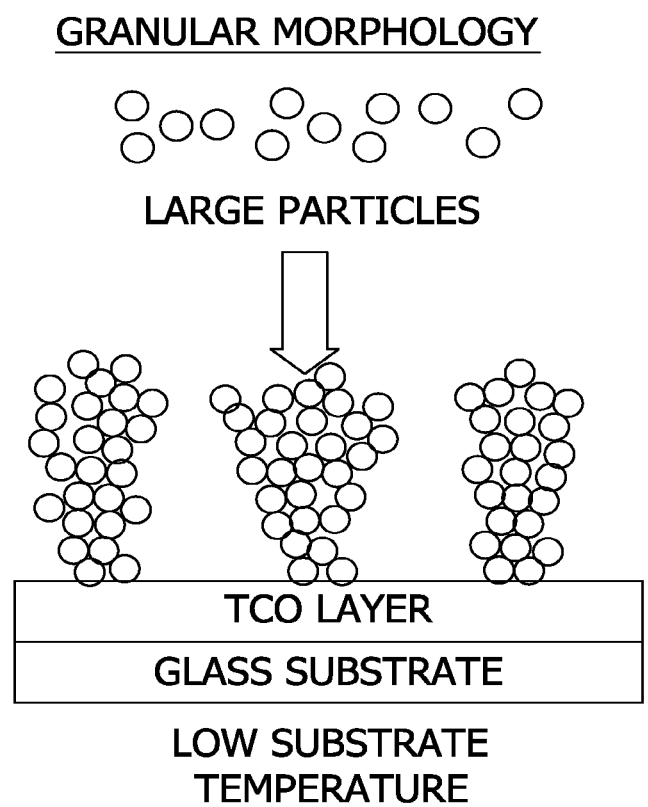
FIGS. 9A-9D depict a series of related films prepared by the flame aerosol reactor of the present invention where
Figure 9B:
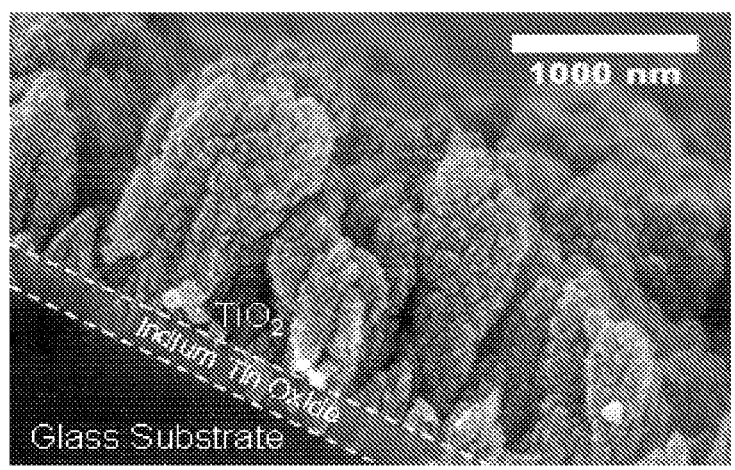
Figure 9C:
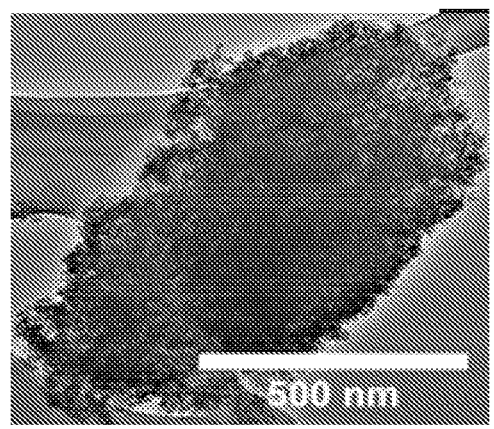
Figure 9D:
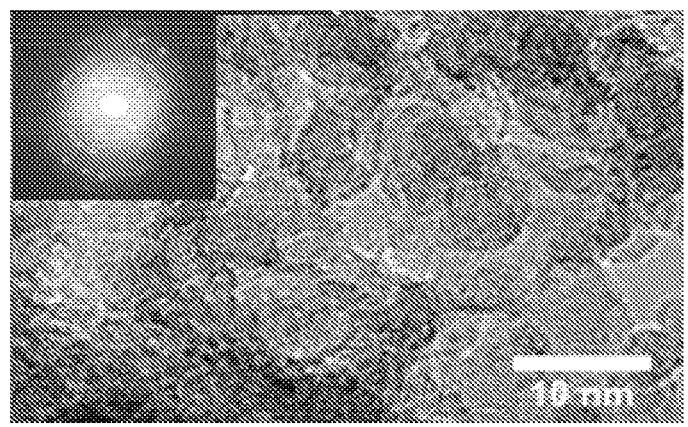
Figure 10:
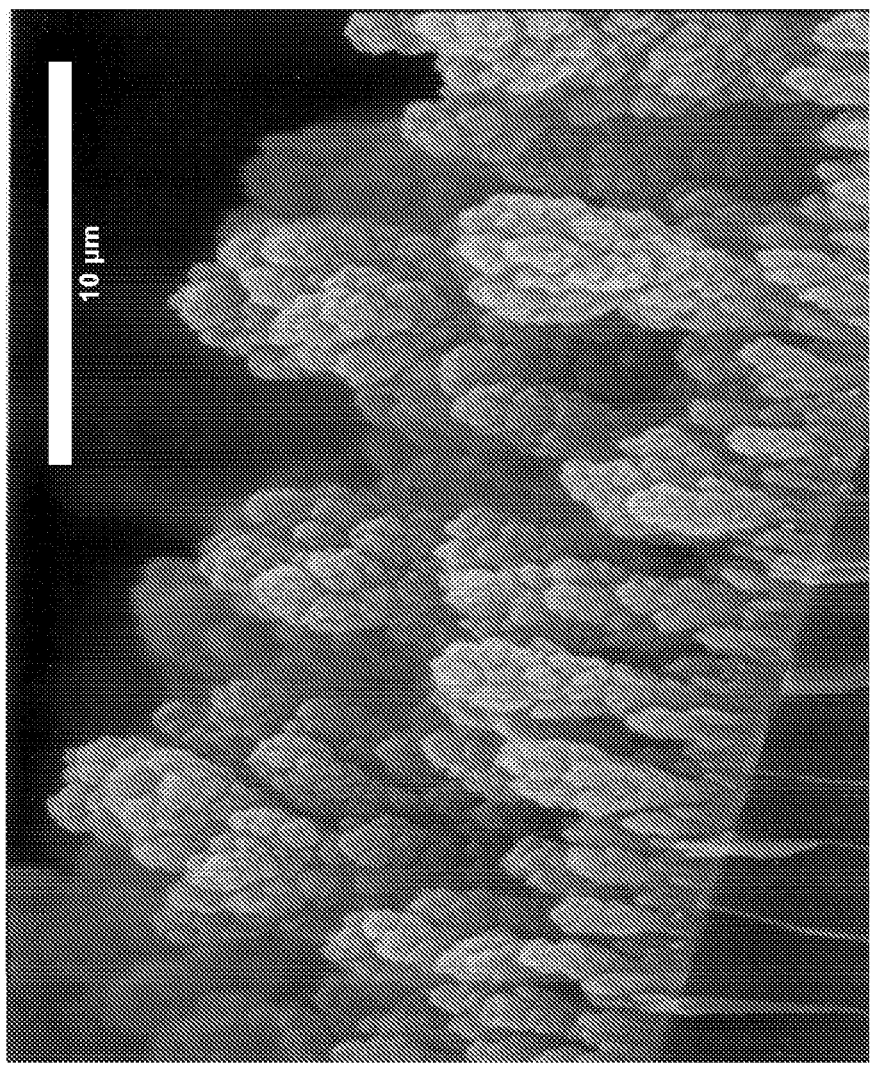
FIG. 10 is a scanning electron micrograph of a side view of a titanium dioxide film of the present invention having granular morphology.
Figure 11:
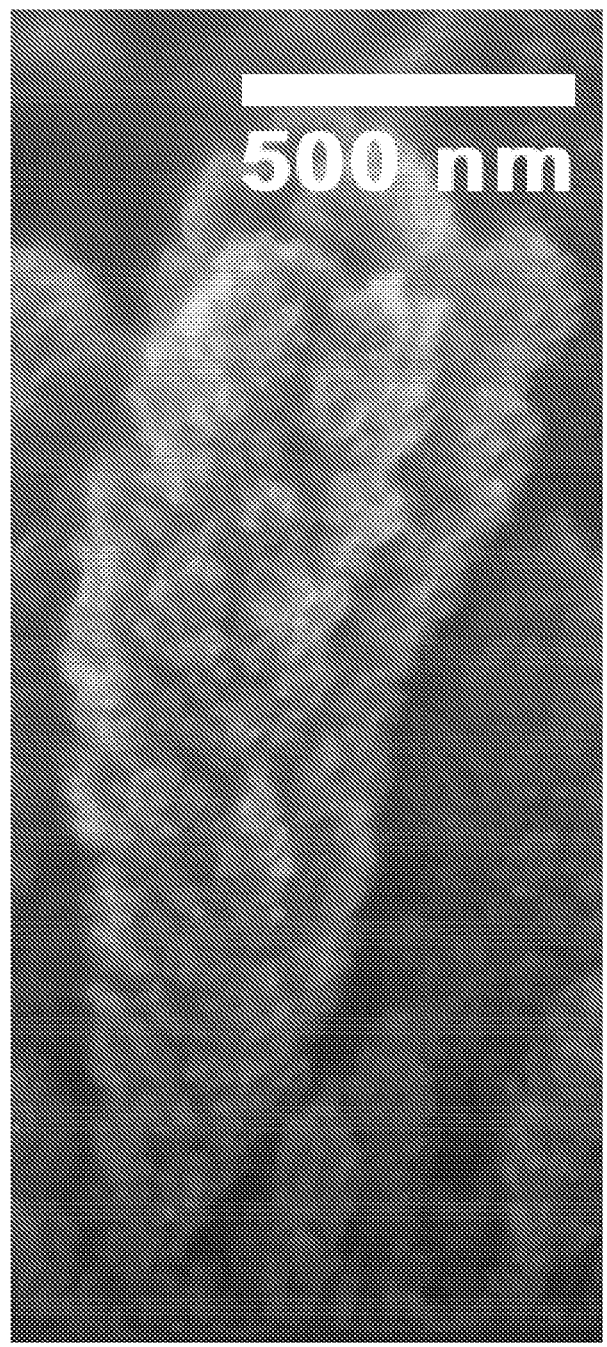
FIG. 11 is a scanning electron micrograph of a side view of a titanium dioxide film of the present invention having granular morphology.
Figure 12:
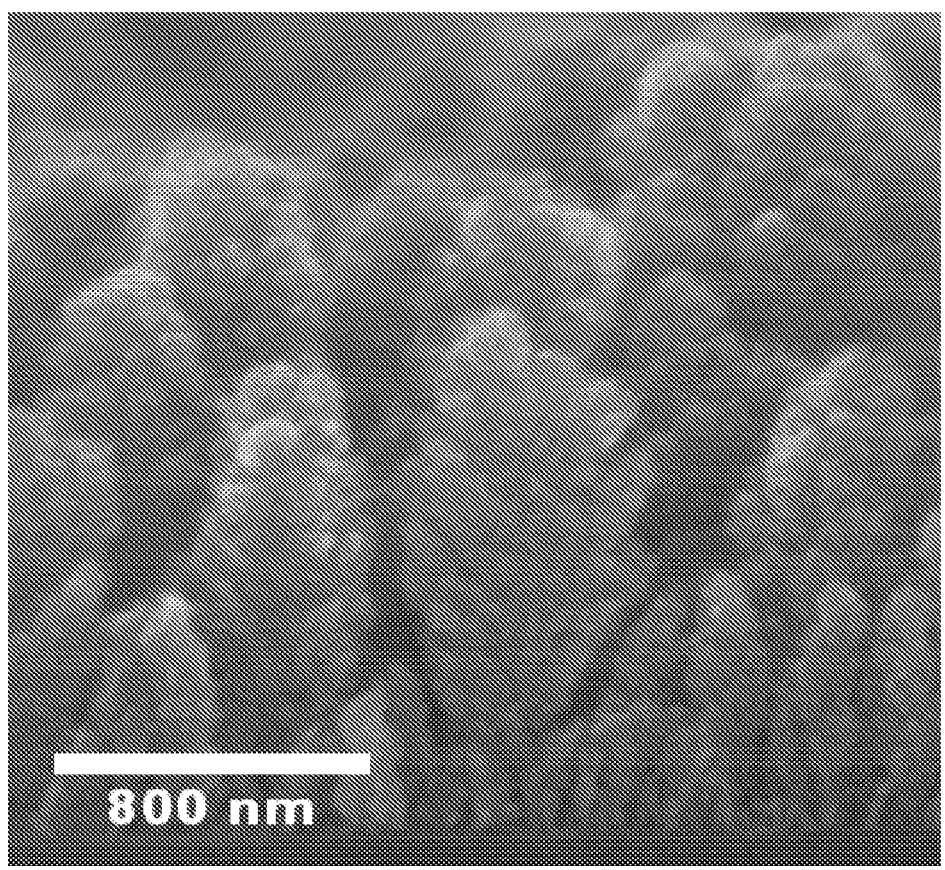
FIG. 12 is a scanning electron micrograph of a side view of a titanium dioxide film of the present invention having granular morphology.
Figure 13:
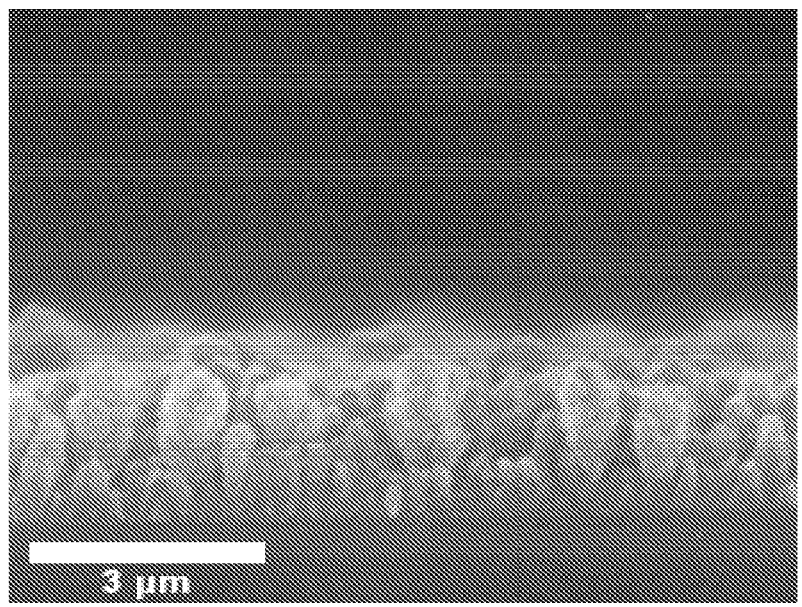
FIG. 13 is a scanning electron micrograph of a side view of a titanium dioxide film of the present invention having granular morphology.

Columnar morphology is defined by two criteria; shape and crystallinity. The shape criterion is that of a column, i.e., continuous individual structures that are oriented roughly normal to the substrate, as illustrated in FIG. 2. The columns are approximately normal to the substrate in that, for example, at least about 80% or at least about 90% of the structures have a central axis which is normal to the substrate ±20 degrees. Those structures have an average width, w, and height, h, where the shape criteria is h>w. Columnar morphology is typically characterized by low surface area and superior electronic properties. Columnar titanium dioxide is depicted in the scanning electron micrograph ("SEM") image of FIG. 2. The crystalline criterion is based on grain size. Grain size is the characteristic dimension, or size, associated with a region of the same crystalline structure and orientation in space, illustrated in FIG. 3. Grain size can be measured by several methods known in the art, including x-ray diffraction (XRD) and transmission electron microscopy (TEM). The grain-size ($X_s$) criterion for the columnar morphology is w/10>$X_s$. In one embodiment, the nanostructure morphology is predominantly columnar where the nanoparticles have an average particle size of less than about 20 nanometers and the columns have a short range crystalline order of about 1 to about 50 nanometers ("nm"). The morphology is predominantly columnar when, for example, at least about 80% or at least about 90% of the deposited metal species-based nanoparticles constitute columns. Columnar morphology generally results when relatively small nanoparticles are deposited onto a cooled, but relatively high temperature, substrate wherein the nanoparticles are restructured by sintering to form columns. Columnar film formation for titanium dioxide is illustrated in FIG. 4 along with SEM side-view images of columnar morphology and SEM images of a highly crystalline single column. Also depicted in FIG. 4 is a TEM image for a highly crystalline single column showing diffraction from the [103] and [101] planes of anatase. Columnar morphology is also depicted in the SEM images in FIG. 5 through FIG. 8.

Granular morphology generally comprises metal species-based nanoparticles caked onto a substrate. Granular morphology generally results when relatively large nanoparticles are deposited onto a relatively low temperature substrate to form fractal structures that undergo minimal restructuring after deposition. The average particle size range is from about 10 nm to about 100 nm. In general, the grain size is less than about three times the size of the metal species-based nanoparticles before deposition. Granular films are characterized by a high surface area and superior reactive properties. Granular film formation on a low temperature glass substrate is illustrated in FIG. 9. Also depicted in FIG. 9 is a SEM of a side view of a titanium dioxide film having granular morphology. Further depicted in FIG. 9 are TEM images of a granular titanium dioxide fractal. Finally depicted in FIG. 9 is a TEM image of titanium dioxide polycrystalline electron diffraction rings corresponding to the [101], [004], [200], [105] and [205] reflections of anatase, moving from the center of the ring outwards. Granular morphology is also depicted in the SEM images in FIG. 10 through FIG. 13.

Based on experimental evidence to date, it is believed that crystalline morphological characteristics such as crystal phase and grain size is generally determined by aerosol phase dynamics and the metal species-based nanoparticle sintering behavior on the substrate.

Figure 14:
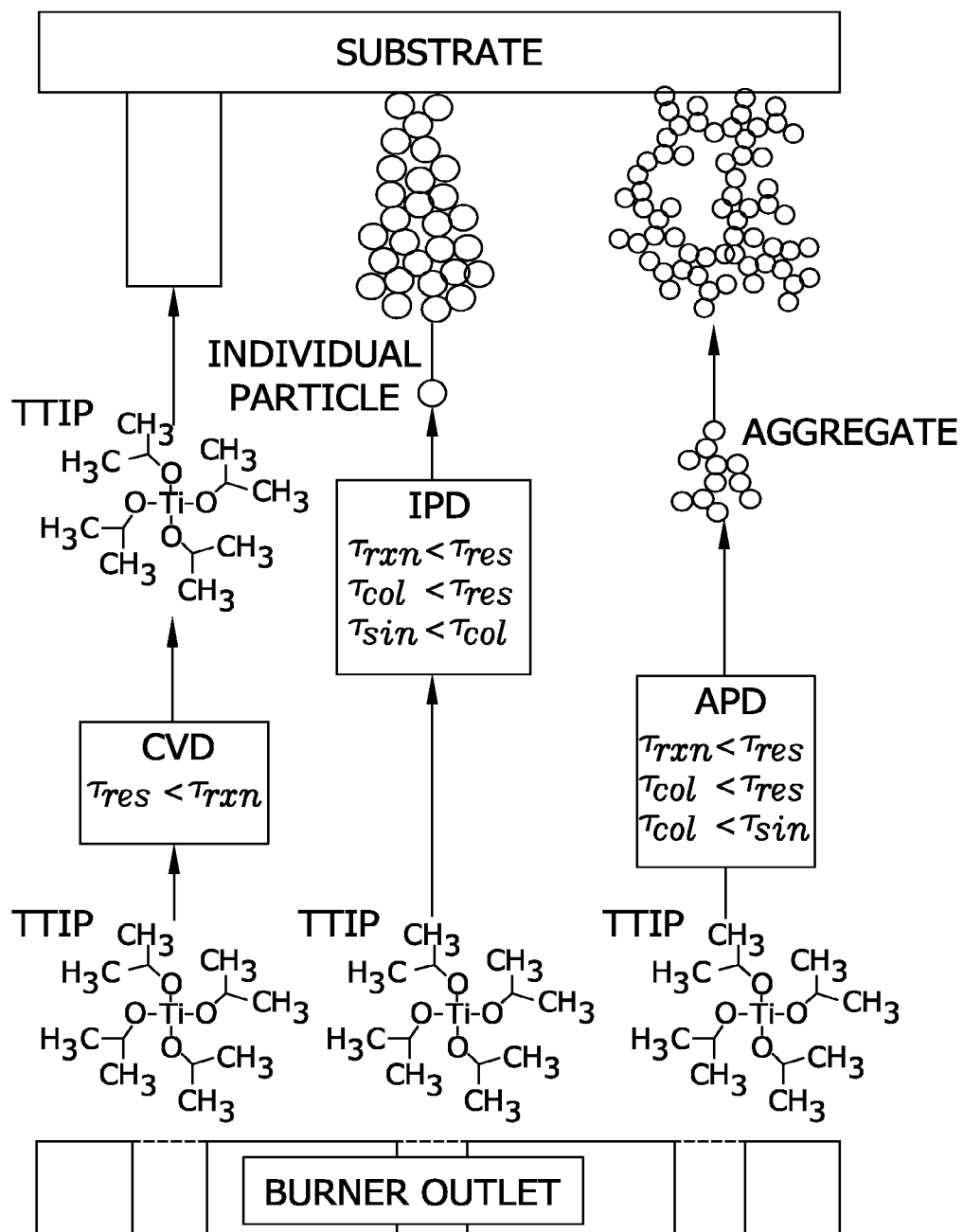
FIG. 14 is a schematic illustration of nanoparticle aerosol dynamics in a flame aerosol reaction for titanium isopropoxide metal precursor where $t_{rxn}$ is the characteristic reaction time for the reaction of the precursor, $t_{res}$ is the nanoparticle residence time in the flame, $t_{coll}$ is the particle-particle characteristic collision time and $t_{sin}$ is the particle sintering time, CVD is chemical vapor deposition, IPD is individual particle deposition and APD is aggregate particle deposition.

Aerosol phase behavior, such as chemical reaction of the precursor and aerosol dynamics, can affect the film morphology as indicated in FIG. 14. If the characteristic reaction time for the reaction of the precursor ("$t_{rxn}$") is larger than the nanoparticle residence time in the flame ("$t_{res}$") then a CCVD or CVD process would be expected. This would result in metal precursor vapor molecules being transported to the substrate and reacting on and/or in the substrate to form metal oxide on the film (in the case of an oxidizing gas). Alternatively, if $t_{rxn}$ is less than $t_{res}$ then the precursor will react in the flame to form metal oxide nanoparticles that are thereafter deposited on the substrate. If the particle sintering time ("$t_{sin}$") is smaller than the collision time ("$t_{coll}$") then nearly spherical nanoparticles will result from the aerosol phase growth process.

Sintering generally results in two small particles combining to form a larger structure with a volume approximately equal to the sum of the two initial volumes. For slow sintering dynamics, films predominantly having granular morphology are typically formed. Alternatively, for rapid sintering dynamics, films predominantly having columnar morphology are typically formed. Sintering is a surface tension driven solid state diffusion process, and is generally a function of both initial particle diameter and temperature (see A. Kobata, K. Kusakabe and S. Morooka, *Growth and Transformation of $TiO_2$ Crystallites in Aerosol Reactor*, AIChE J., 37, pp. 347-359, (1991); and K. Cho and P. Biswas, *Sintering rates for pristine and doped titanium dioxide determined using a tandem differential mobility analyzer system*, Aerosol Sci Tech, 40, pp. 309-319, (2006)). Without being bound to any particular theory, it is believed that the characteristic time for two particles of the same initial diameter to completely sinter into an equivalent-volume sphere, scales with initial diameter to the fourth power and exponentially decreases with increasing temperature. Thus, for smaller particles and higher temperatures, sintering is rapid; and for larger particles and lower temperatures, sintering is slow. Therefore, arrival size of particles at the substrate and the substrate temperature are two parameters that can be varied to influence the film morphology. Particle size, in turn, is a function of various process parameters and the interaction of those process parameters. Process parameters include the metal precursor compound, metal precursor feed rate, the fuel source, the oxidizer source, the flame temperature, residence time of formed metal nanoparticles in the flame region and distance from the flame to the substrate.

The flame temperature may be adjusted by varying the fuel gas, by varying the ratio of fuel gas to oxidizer gas (i.e., flame stoichiometry), by introducing a non-reactive (i.e., inert gas) into one or more of the fuel gas, oxidizer gas or metal precursor streams, or by combinations thereof. For example, a hydrocarbon fuel gas typically produces a cooler flame than does hydrogen or sodium. In one embodiment, a hydrocarbon fuel gas can be admixed with hydrogen. The presence of non-reactive gases will act to reduce flame temperature. Flame temperature can vary from about 200° C. to about 5000° C., from about 300° C. to about 4000° C. or even from about from about 300° C. to about 4000° C. Depending on the identity of the metal species-based nanoparticle, the temperature can be, for example, about 500° C., 600° C. 700° C., 800° C., 900° C., 1000° C., 1100° C. 1200° C., 1300° C., 1400° C., 1500° C., 1600° C., 1700° C., 1800° C., 1900° C., 2000° C., 2100° C., 2200° C., 2300° C., 2400° C., 2500° C., 2600° C., 2700° C., 2800° C., 2900° C., 3000° C., 3100° C., 3200° C., 3300° C., 3400° C., 3500° C., 3600° C., 3700° C., 3800° C., 3900° C. or even 4000° C. or more. In the case of titanium dioxide nanoparticles, a temperature between about 2500° C. and about 3500° C. is preferred.

The temperature of the substrate can also affect sintering rate. Experimental evidence to date indicates that at low temperatures granular films are formed due to the low sintering rate amongst the deposited particles. At higher substrate temperatures, will sintered columnar films can be obtained. At very high temperatures the films can anneal out resulting in the collapse of formed columnar structures. Substrate temperature can be controlled by various means. As depicted in FIG. 1, one surface 39 of the substrate 35 is in direct or indirect contact with a surface 41 of cooled heat sink 40 for control of the temperature of substrate surface 37. In one embodiment, the temperature of surface 41 can be controlled by recirculating a cooling fluid such as water, glycol, brine or the like through heat sink 40. A thermocouple (not depicted in FIG. 1) can be used to monitor the temperature at or near surface 41 or at or near substrate surface 39. The thermocouple can be integrated with a cooling fluid flow control means, such as a valve, to form a temperature control loop for the maintenance of substrate temperature at a preselected setpoint. In another embodiment, substrate surface 39 can be controlled by passing a gas, such as air, over the surface. In yet another embodiment, one or more thermal resistance devices 42 can be inserted between substrate surface 39 and cooled heat sink surface 41. Selection of a thermal resistance device depends on the desired substrate surface 37 temperature. Typical devices include heat-treated glass, stainless steel and aluminum. Depending upon the identity of the metal species-based nanoparticle deposited on the substrate and the desired morphology, the substrate temperature can be controlled in the range of about 20° C. to about 2000° C., for example, about 20° C., 50° C., 100° C., 150° C., 200° C., 250° C., 300° C., 350° C., 400° C., 450° C., 500° C., 550° C., 650° C., 700° C., 750° C., 800° C., 850° C., 900° C., 950° C., 1000° C., 1050° C., 1100° C., 1150° C., 1200° C., 1250° C., 1300° C., 1350° C., 1400° C., 1450° C., 1500° C., 1550° C., 1600° C., 1650° C., 1700° C., 1750° C., 1800° C., 1850° C., 1900° C., 1950° C. or even about 2000° C. In the case of titanium dioxide, a substrate temperature range of about 20° C. to about 350° C. will generally yield a granular type film while substrate temperatures in excess of 350° C. will generally yield a columnar type film.

Metal precursor feed rate affects nanoparticle film morphology through the relationship to formed nanoparticle size. For a given substrate temperature, sintering dynamics are influenced by the size of the nanoparticles as they arrive at the substrate. Small nanoparticles tend to sinter at a faster rate than do larger nanoparticles. High metal precursor feed rates produce large metal species-based nanoparticles and low metal precursor feed rates produce small metal species-based nanoparticles. Large nanoparticles favor the formation of granular type films whereas small nanoparticles favor the formation of columnar type films. However, given sufficient sintering time, even large nanoparticles can form columnar films. Metal species-based nanoparticles having an average size of less than about 100 nm, less than about 50 nm or even less than about 20 nm are preferred for columnar films. In one embodiment, two or more metal species-based nanoparticles combine to form an aggregate before deposition onto the substrate.

Film thickness can be controlled by metal precursor feed rate, deposition time, and combinations thereof. A film thickness of from about 10 nm to about 1 mm is preferred with narrower preferred ranges primarily being dictated by the intended use. For instance, for optoelectrical films a thickness of from about 10 nn to about 20 micrometers ("μm") is preferred. For a catalytic films a thickness of from about 1 μm to about 1000 μm is preferred.

The nanostructured films of the present invention are useful for the preparation of high efficiency photo-water-splitting cells for the preparation of hydrogen gas and for the preparation of high efficiency dye-sensitized solar cells and p/n junction oxide solar cells.

Figure 28:
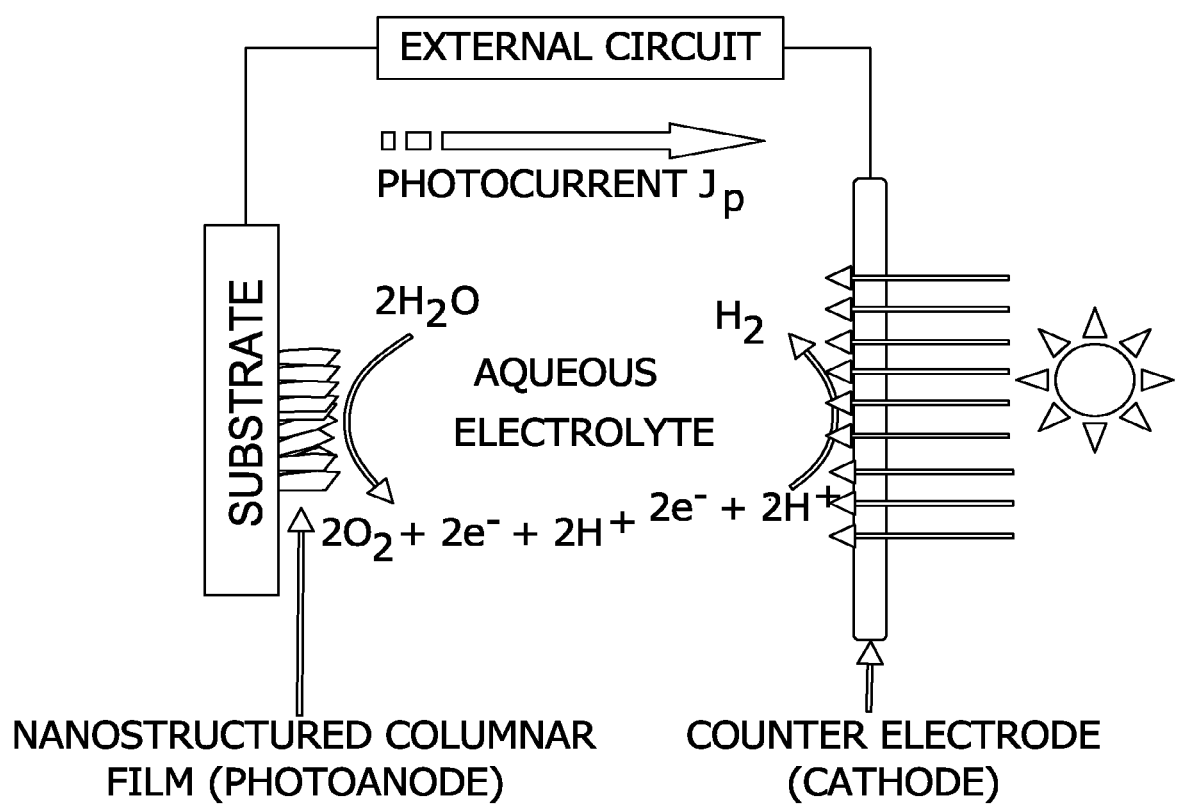
FIG. 28 is a schematic illustration of a photo-watersplitting cell of the present invention.

In one embodiment, depicted in FIG. 28, photo-water-splitting cells are prepared from the nanostructured films of the present invention. The cell comprises a substrate with a nanostructured film having columnar morphology that functions as a photoanode, a counter electrode (cathode) and an external circuit. The film is illuminated by sunlight and uses the energy in the sunlight to split water into hydrogen and oxygen. It is expected that photoelectrodes based the columnar morphology will achieve sunlight-to-hydrogen conversion efficiencies of approximately 10%, 11%, 12%, 13%, 14% or even 15%.

Figure 29:
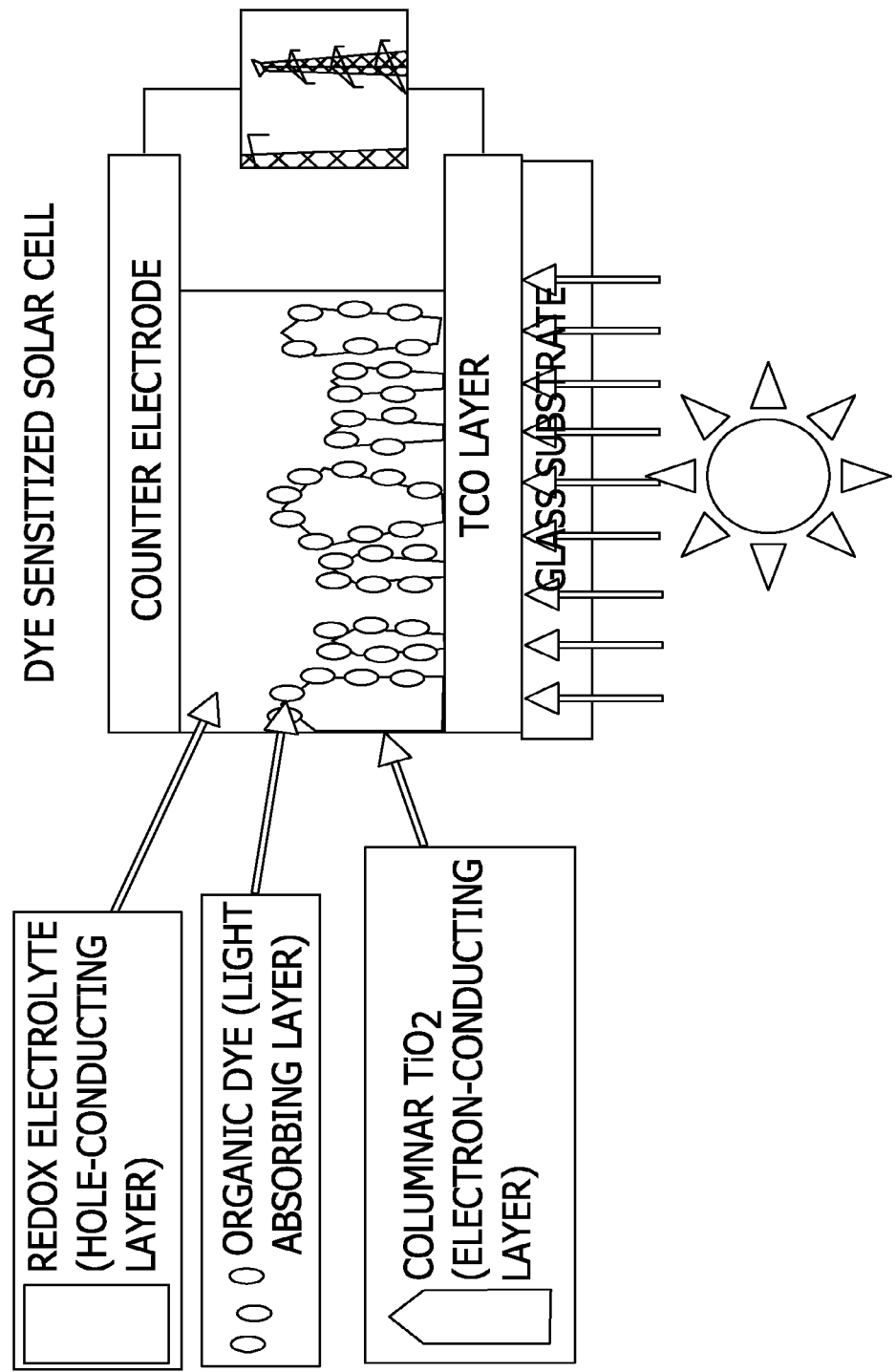
FIG. 29 is a schematic illustration of a dye sensitized solar cell of the present invention.

In another embodiment, depicted in FIG. 29, dye sensitized solar cells are prepared from the nanostructured films of the present invention that convert sunlight to electricity at high efficiency. The cells comprise an electron conducting layer formed from the columnar films of the present invention, a light absorbing layer such as an organic dye, and hole-conducting layer (redox electrolyte) Sunlight is harvested in the light absorbing layer, which then injects electrons into the electron-conducting layer and holes in the hole-conducting layer. One or all of the layers can be formed from the columnar films of the present invention. Sunlight-to-electricity conversion efficiencies of 10%, 11%, 12%, 13%, 14%, 15%, 16%, 17%, 18%, 19% or even 20% are expected.

Figure 30:
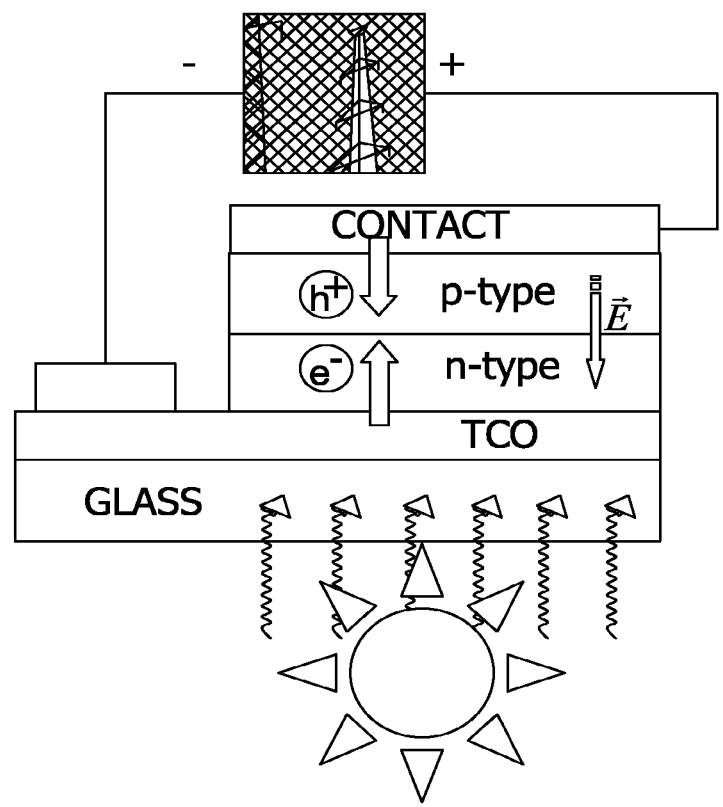
FIG. 30 is a schematic illustration of a p/n junction oxide solar cell of the present invention.

In yet another embodiment, depicted in FIG. 30, p/n junction solar cells could be prepared from the nanostructured films of the present invention that convert sunlight to electricity at high efficiency. The cells comprise two layers, an n-type oxide semiconductor layer (e.g. $TiO_2$) where electrons are the mobile charge-carrier, and a p-type (e.g. NiO) layer where holes are the mobile charge carrier. There is a depletion zone between the two layers that drives charge-carriers to the interface, thus driving electricity through the external circuit. This design is similar to conventional silicon solar cells. The p and n layers can be formed from semiconductors formed from the columnar metal oxides of the present invention. Such devices are expected to convert sunlight to electricity with an efficiency of 10%, 11%, 12%, 13%, 14%, 15%, 16%, 17%, 18%, 19% or even 20%.

Having described the invention in detail, it will be apparent that modifications and variations are possible without departing from the scope of the invention defined in the appended claims.

EXAMPLES

The following non-limiting examples are provided to further illustrate the present invention.

Example 1

The experimental apparatus comprised a precursor feed system, a FLAR and a temperature controlled deposition substrate as generally depicted in FIG. 1. The precursor feed system comprised a bubbler containing titanium isopropoxide (TTIP, Aldrich: 205273, 97% purity) through which argon (Grade 4.8) that was bubbled at varying flow rates. The temperature of the bubbler was maintained at 30° C. To prevent condensation of the TTIP, the lines leading up to the flame reactor were heated to approximately 50° C. The TTIP feed rate was calculated based on the saturation pressure and was assumed to be proportional to the argon flow rate through the bubbler. An additional argon line was added so the total argon flow rate could be held constant at 2.0 Lpm (liters per minute at STP) while varying the flow through the bubbler. The FLAR was a premixed methane-oxygen burner made of a 0.95 cm (⅜ inch) O.D. stainless steel tube into which was placed three 0.32 cm (⅛ inch) tubes designed to achieve an optimal outlet velocity (about 450 cm/s) through a 0.16 $cm^2$ area which prevented flame blow off and extinction. The methane flow rate was fixed at 0.5 Lpm and the oxygen flow rate was fixed at 1.5 Lpm, above the stoichiometric value of 1.0 Lpm for complete combustion. The additional oxygen was provided to ensure complete oxidation of TTIP to produce stoichiometric $TiO_2$. All gas flow rates were controlled by digital mass flow controllers (MKS Instruments, Wilmington Mass.), and the four gas streams were combined and sent through the burner to the flame region.

The flame temperature distribution was measured using a type R thermocouple (Pt—Rh:Pt 2 mm bead) and corrected for radiation from the thermocouple bead. The average flame temperature was 1927° C.±100° C. A temperature controlled substrate was used onto which the titanium dioxide particles formed in the flame were deposited. The substrate was a square piece of optically polished silicon, 1.5 cm on a side. The silicon substrate was attached to a water-cooled heat sink to control the temperature of the substrate and the resultant crystal phase of the film (anatase versus rutile). Intimate thermal contact was established between the substrate and heat sink by applying a small amount of silver thermal paste (Arctic Silver, Visalia Calif.).

The substrate temperature was approximately 427° C., as measured by a small-bead type K thermocouple cemented to the substrate surface, when the silicon substrate was pasted directly to the heat sink. The thermal resistance of the substrate to heat-sink interface was increased by inserting an intermediate piece of high-temperature glass (Ace-Glass, Vineland N.J.) between the substrate and the heat sink. Under those conditions, the resulting temperature of the substrate was 637° C. An even higher temperature was achieved by inserting a second piece of glass which increased the substrate temperature to approximately 807° C. However, unless otherwise stated, only one intermediate piece of glass was used and particles were deposited at a substrate temperature of 637° C.

Particles in the aerosol phase in the flame region (i.e., before deposition onto the substrate) were characterized by measurements by TEM (JEOL 1200 120 kV) and online scanning mobility particle spectrometry (SMPS) (Platform 3080, Nano-DMA 3085, TSI Corp., Shoreview Minn.) TEM and SMPS measured two different particle size distributions. From TEM images, the primary particle size distribution was obtained, which is a characteristic for dynamic processes such as sintering. The SMPS measured the mobility equivalent aerosol size distribution. The mean size measured by the SMPS could be larger than the primary particle size, especially if agglomeration is prevalent in the system.

After substrate deposition, the $TiO_2$ films where characterized by SEM (Hitachi model S-4500 field emission electron microscope operating at 15 kV) to determine film thickness and morphology. For thickness measurements the silicon substrates were cleaved down the middle of the film and attached vertically to the SEM specimen mount. The films were then imaged along a line of sight parallel to the substrate surface to obtain side view images. The crystalline phase and grain size of the films were determined using x-ray diffraction ("XRD") (Rigaku DMax x-ray diffractometer).

The effect of metal precursor (TTIP) feed rate and deposition time on formed film characteristics were evaluated. Those parameters were independently varied to determine the effects on the aerosol phase particle size distributions, film grain size, growth rate, film thickness, crystalline phase, and photocurrent.

In a series of 15 trials as reported in Table 1 below, the metal precursor gas, methane gas and oxygen were supplied to the FLAR apparatus described above. The gas phase metal precursor was rapidly oxidized in the high temperature environment to form nanoparticles. The nanoparticles were then directed by thermophoretic forces from the hot gas to the water-cooled substrate and deposited to form a film.

A summary of the experimental parameters and results is presented in Table 1 where TTIP feed rate is in mmol/hr, Average $D_p$ from TEM is reported in nm, Average $D_p$ from SMPS is reported in nm, Film thickness was measured by SEM and is reported in nm, Crystal. phase refers to crystalline phase and was measured by XRD, Grain size was measured by XRD and is reported in nm, Average growth rate is reported in nm/sec, and Photocurrent is reported in nanoamperes ("nA").

TABLE 1

| | Experimental Conditions | | Aerosol Phase Measurements | |
|---|---|---|---|---|
| Trial | Deposition Time (sec) | TTIP Feed Rate | Average $D_p$ from TEM | Average $D_p$ from SMPS |
| 1 | 90 | 0.27 | — | 10.8 |
| 2 | 180 | 0.069 | 4.5 | 4.3 |
| 3 | 180 | 0.14 | — | 7.2 |
| 4 | 180 | 0.27 | — | 10.8 |
| 5 | 180 | 0.55 | 8 | 13.1 |
| 6 | 360 | 0.069 | 4.5 | 4.3 |
| 7 | 360 | 0.27 | — | 10.8 |
| 8 | 60 | 0.14 | — | 7.2 |
| 9 | 90 | 0.14 | — | — |
| 10 | 120 | 0.14 | — | 7.2 |
| 11 | 240 | 0.14 | — | 7.2 |
| 12 | 360 | 0.14 | — | — |
| 13 | 480 | 0.14 | — | 7.2 |
| 14 | 760 | 0.14 | — | — |
| 15 | 960 | 0.14 | — | 7.2 |

| | Trial Film Measurements | | | |
|---|---|---|---|---|
| | Film Thickness | Crystal. Phase | Grain Size | Average Growth Rate | Photo-Current |
| 1 | 180 | — | — | 2 | — |
| 2 | 79 | Anatase | 47.3 | 0.44 | 46.86 |
| 3 | 213 | Anatase | 49.1 | 1.18 | 22.1 |
| 4 | 322 | Anatase | 40.7 | 1.79 | 0.64 |
| 5 | 2010 | Anatase | 9 | 11.17 | 2.53 |
| 6 | 233 | — | — | 0.65 | — |
| 7 | 730 | — | — | 2.03 | — |
| 8 | 42 | Anatase | — | 0.7 | — |
| 9 | 64 | Anatase | — | — | 2.6 |
| 10 | 86 | Anatase | — | 0.72 | — |
| 11 | 204 | Anatase | — | 0.85 | — |
| 12 | 311 | Anatase | — | — | 1200 |
| 13 | 417 | Anatase | — | 0.87 | — |
| 14 | 692 | Anatase | — | — | 15,000 |
| 15 | 889 | Anatase | — | 0.93 | — |

In reference to FIG. 14 and Table 2 below, the various aerosol phase characteristic times were estimated to determine which deposition process was dominant. The residence time in the flame was estimated by assuming that the flame cross-section was equal to the burner outlet area (i.e., no jet expansion or ambient fluid entrainment) and gases immediately reached the flame temperature and the path-length was equal to the burner-substrate distance of 2 cm. Under those assumptions, a residence time ($t_{res}$) of 0.59 ms was calculated. The calculated characteristic reaction time of the TTIP thermal decomposition was 0.12 ms, which was less than the residence time, implying that TTIP rapidly reacts to form $TiO_2$ particles in the flame. The characteristic particle-particle collision time (assuming 5 nm particles and a $TiO_2$ molecular concentration calculated from the TTIP feed rate (about $10^{15} cm^{-3}$)) was about 0.1 ms and the sintering time for the 5 nm particles was $7.4 \times 10^{-5}$ ms, implying that particles are present as individual spheroids in the flame. Under the flame conditions used in this study, individual particle deposition was determined to be the dominant process for deposition.

TABLE 2

Summary of estimated characteristic times encountered in the aerosol phase

| Characteristic Time | Symbol | Value |
|---|---|---|
| Residence time in flame | $t_{res}$ | 0.59 ms |
| Thermal decomposition time for formation of $TiO_2$ from TTIP | $t_{rxn}$ | 0.12 ms |
| 5 nm particle-particle collisions | $t_{coll}$ | about 0.1 ms |
| 5 nm particle sintering at 1927° C. | $t_{sin}$ | $7.4 \times 10^{-5}$ ms |

Figure 15A:
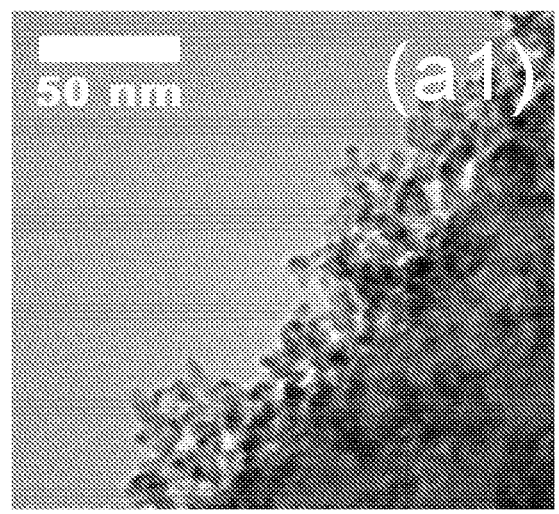
FIGS. 15A-15C depict a series of related transmission electron microscopy image and particle size distributions where
Figure 15B:
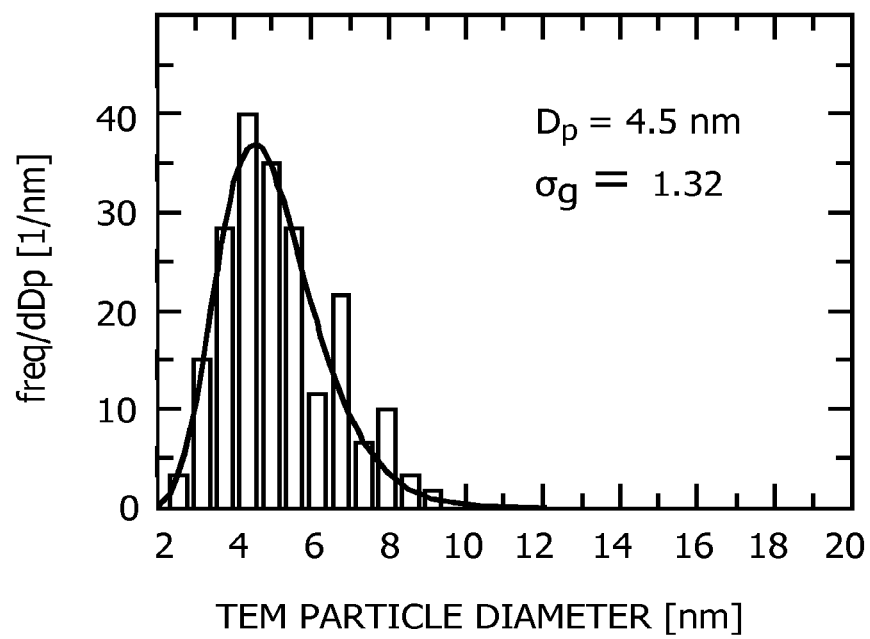
Figure 15C:
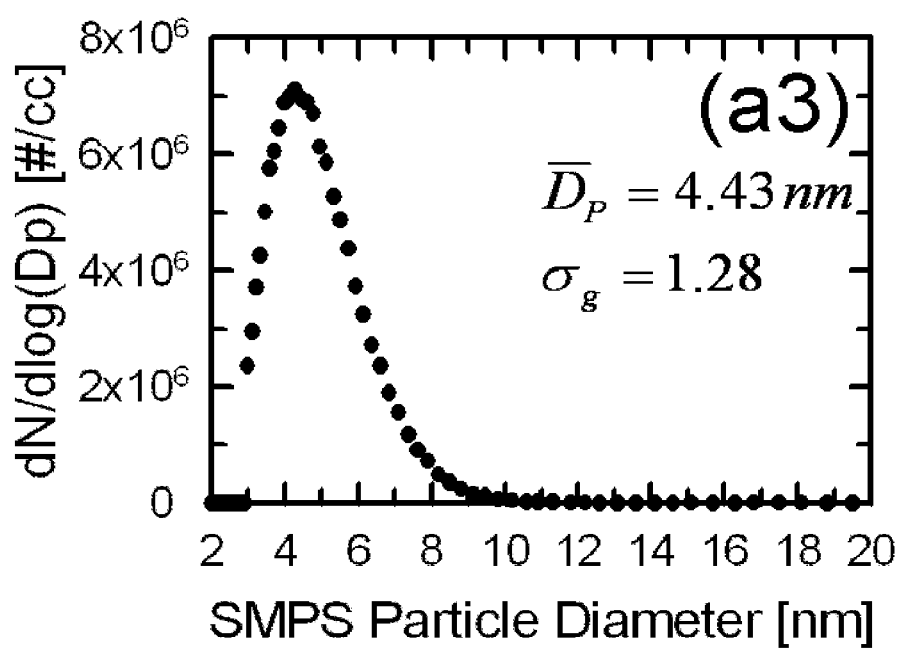
Figure 16A:
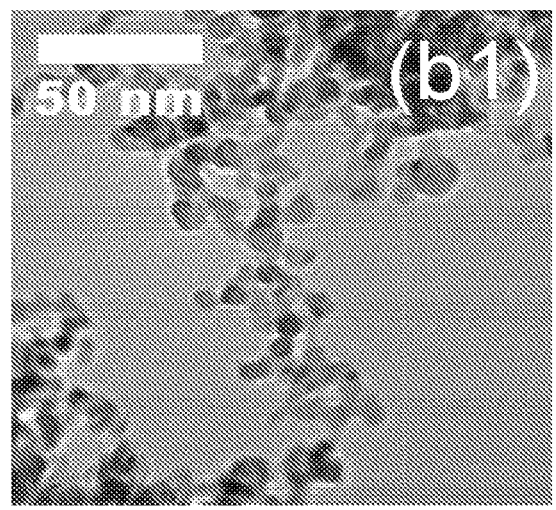
FIGS. 16A-16C depict a series of related transmission electron microscopy image and particle size distributions where
Figure 16B:
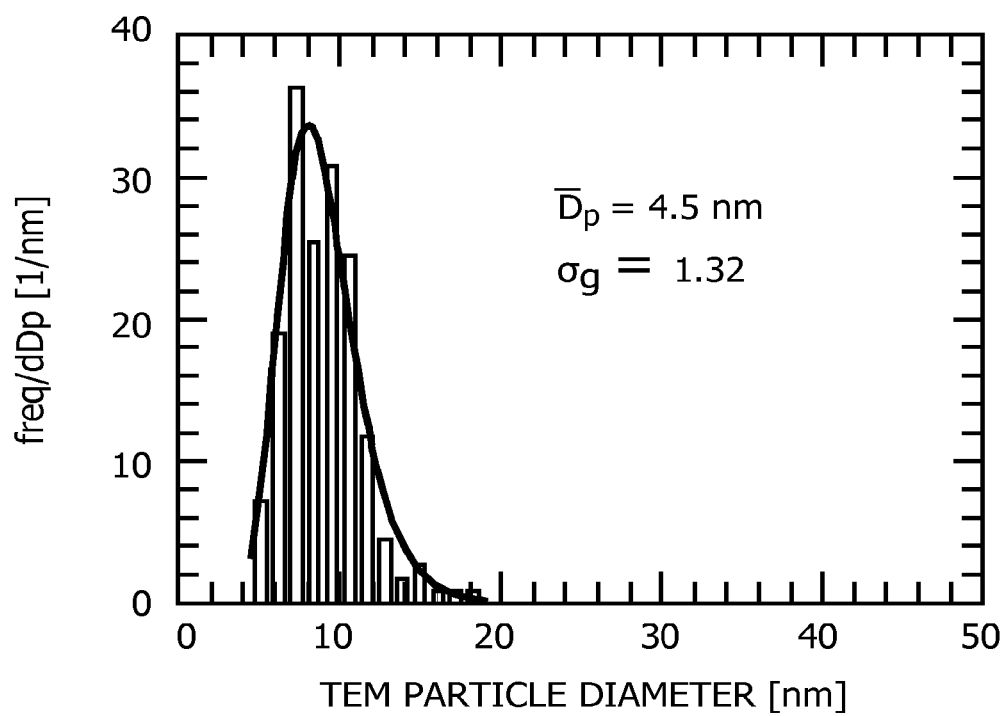
Figure 16C:
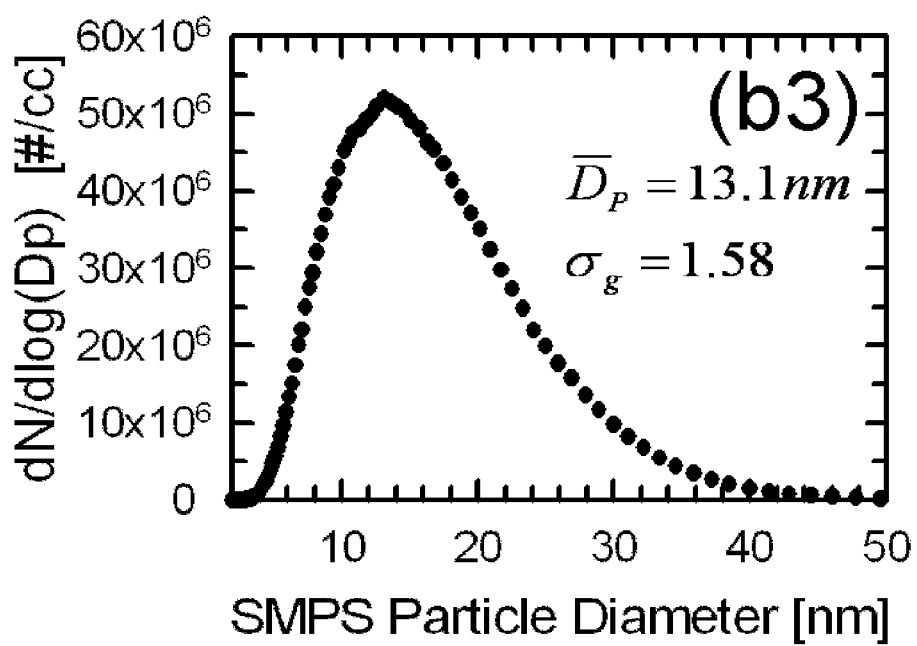

The effect of TTIP feed rate on the particle size distribution is shown in FIG. 15 and FIG. 16. The aerosol size distribution was measured online with the SMPS. The primary particle size distribution was measured from TEM images by measuring the diameters of about 130 particles. A log-normal curve fit was performed using Origin (Microcal, v 4.1) to determine distribution parameters. The particle size increased from a mean of 4.5 nm at a TTIP feed rate of 0.069 mmol/hr (Trial 2 and FIG. 15) to 8.0 nm at a TTIP feed rate of 0.55 mmol/hr (Trial 5 and FIG. 16), as measured by TEM. For the lower TTIP feed rate the SMPS measurement agreed well with the TEM. However, at the higher TTIP feed rate, the SMPS measured a larger diameter than the one obtained from TEM. The discrepancy between the particle size measured from TEM and SMPS at the higher feed rate was likely due to biases that resulted from agglomeration in the dilution probe during sampling. Despite this small discrepancy, the measurements clearly illustrated the trend of increasing particle size with increasing TTIP feed rate.

It is believed, without being bound to any particular theory, that the increase in particle size as a function of TTIP feed rate was due to enhanced coagulational growth in the flame region. At the flame temperature, the reaction to form $TiO_2$ molecules from TTIP was fast ($t_{rxn}$ of 0.12 ms, Table 2 and FIG. 14). Once formed, the $TiO_2$ molecules collided to form particles which subsequently grew through a coagulational growth process. The sintering time ($t_{sin}$ of $7.4 \times 10^{-5}$ ms, Table 2 and FIG. 14) was much smaller than the collision time ($t_{coll}$ about 0.1 ms, Table 2 and FIG. 14) under those conditions, ensuring that near spherical particles resulted from the aerosol phase particle growth process. For a constant residence time, the final size of the coagulational growth process scaled with the initial concentration of $TiO_2$ molecules, or TTIP feed rate. Through the TTIP feed rate, the size of particles as they arrived at the substrate was tuned to control the restructuring dynamics on the substrate.

Figure 17A:
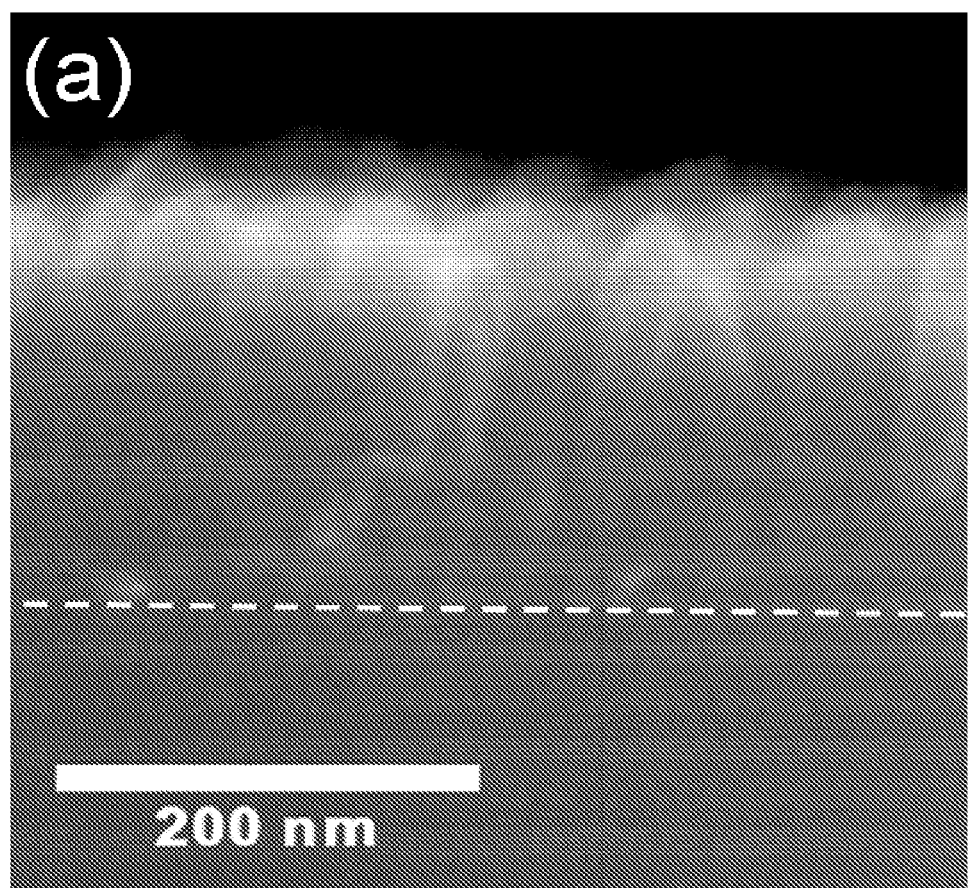
FIGS. 17A and 17B depict two related scanning electron micrograph side view images where

Through its influence on the particle arrival size, which changed the film restructuring dynamics, it is believed that the TTIP feed rate affected the final film grain size and morphology. The arrival size of particles at the substrate was approximately 4.5 nm and 8.0 nm for TTIP feed rates of 0.069 mmol/hr (Trial 2 and FIG. 15) and 0.55 mmol/hr (Trial 5 and FIG. 16), respectively. The characteristic sintering time for the higher TTIP feed rate was an order of magnitude longer than for the lower TTIP feed rate, thus changing the sintering dynamics and final film morphology. This difference in morphology can be seen in FIG. 17 by comparing the scanning electron micrograph side view images of titanium dioxide prepared in a flame aerosol reactor at an titanium isopropoxide metal precursor feed rate of 0.069 millimols per hour for 180 seconds and imaged at high resolution (a) versus titanium dioxide prepared at an isopropoxide metal precursor feed rate of 0.55 millimols per hour for 180 seconds and imaged at low resolution (b1) and at an isopropoxide metal precursor feed rate of 0.55 millimols per hour for 180 seconds and imaged at high resolution (b2). For small particle arrival size, or fast sintering dynamics, a columnar structure was observed (FIG. 17(a)). The sintered columnar morphology was characterized by continuous vertical columns, observed in the SEM, and large average grain size, measured from XRD peak broadening using the Scherrer equation. As small particles, which were 4.5 nm in the aerosol phase, sintered, they combined to form larger structures that had longer range crystalline order, hence the 47 nm grain size observed in the XRD (Trial 2).

Figure 17B:
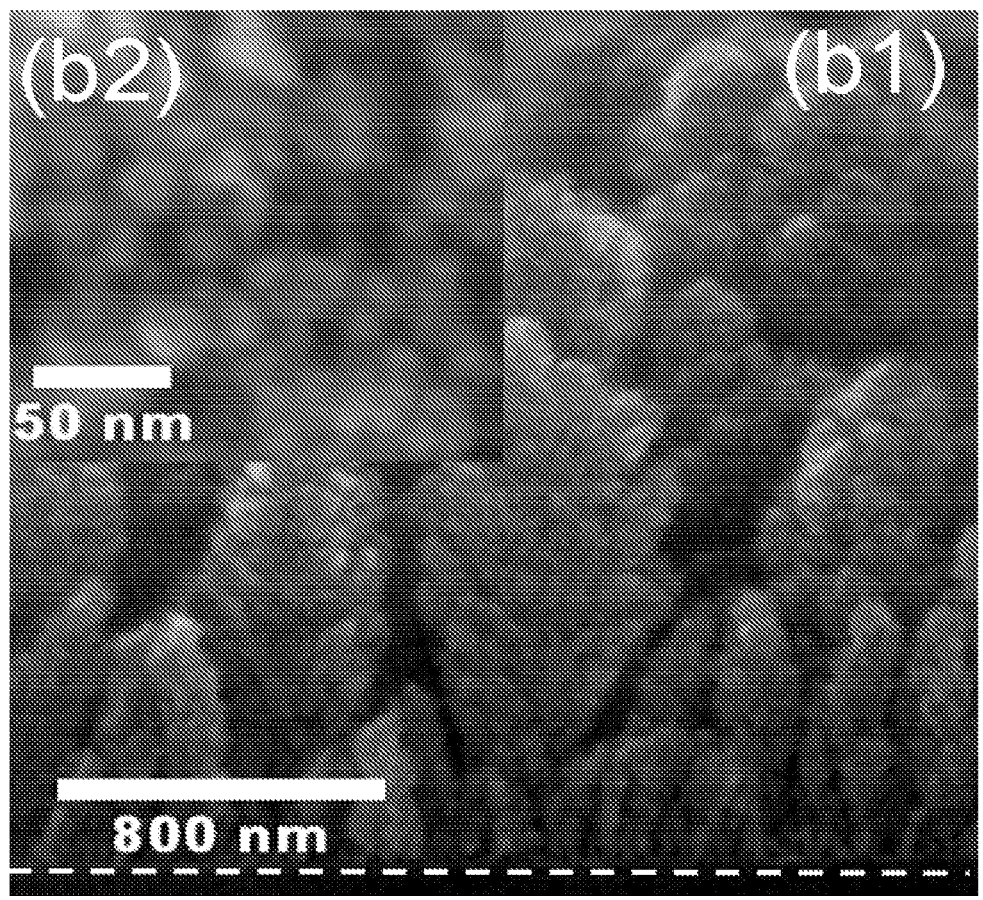
Figure 18:
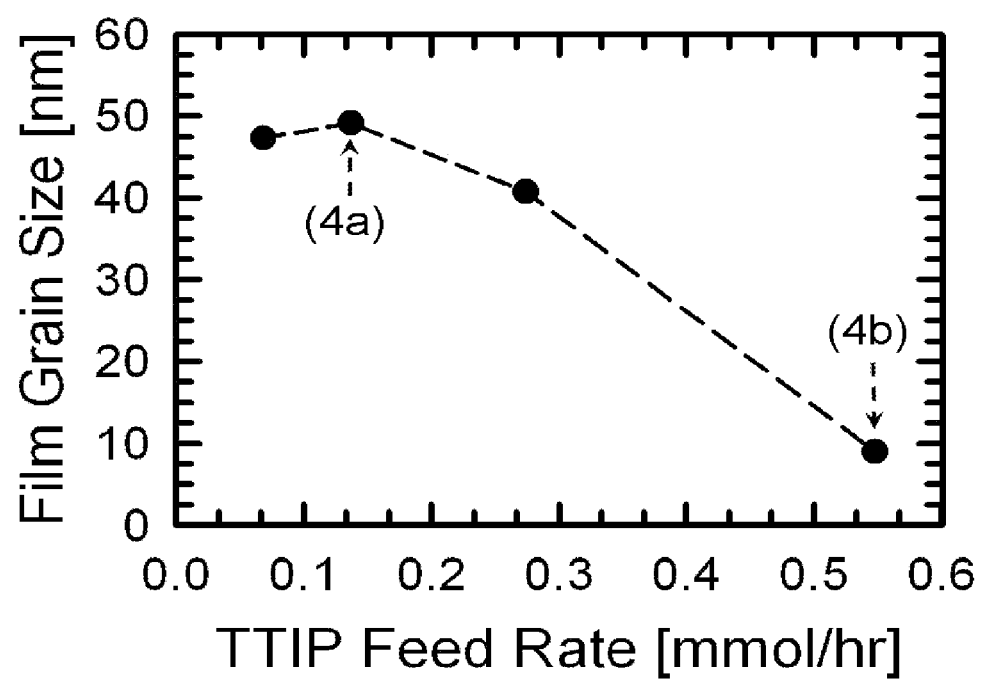
FIG. 18 is an illustration of titanium dioxide film grain size in nm versus titanium isopropoxide metal precursor feed rate for a fixed feed time of 180 seconds. The point labeled 4a corresponds to the film depicted in FIG. 17(a) and the point labeled 4b corresponds to the film depicted in FIGS. 17(b1) and (b2).

Alternatively, for large particle arrival size, or slow sintering dynamics, a granular particulate morphology was observed (FIGS. 17(b1) and (b2)). The particulate morphology was characterized by fractal structures, observed in the SEM and a small average grain size. Due to the slow sintering dynamics, the large particles did not combine and instead remained isolated with approximately the same grain size as was present in the original particle before it deposited. This can be seen by comparing the average grain size of the unsintered film deposited at 0.55 mmol/hr TTIP feed rate (FIG. 18) to the aerosol phase particle size from TEM at the same conditions (FIG. 16). Due to the 1927° C. flame temperature, the particles in the aerosol phase were expected to be nearly single crystal. From the TEM measurements, the large particles were approximately 8 nm before they deposited onto the substrate, which is similar to the 9 nm grain size of the film, which would be expected if the particles did not experience significant sintering once deposited onto the substrate.

The temperature of the substrate was evaluated to determine the affect on the sintering rate. This was verified qualitatively by changing the substrate to heat sink thermal resistance, to alter the substrate temperature. At low temperatures, particulate films were observed in the SEM, due to low rates of sintering amongst the deposited particles. At higher substrate temperatures, well sintered columnar films were obtained that were similar in appearance to the sintered columnar SEM images (FIG. 17(a)).

Figure 19A:
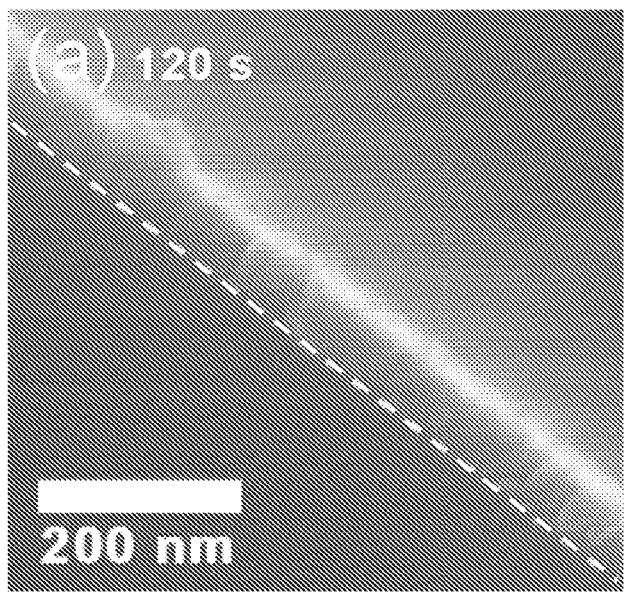
FIGS. 19A-19C are a series of related scanning electron micrograph side view images of titanium dioxide films of the present invention prepared in a flame aerosol reactor at a titanium isopropoxide metal precursor feed rate of 0.14 millimols per hour for 120 seconds (FIG. 19A), 240 seconds (FIG. 19B), and 960 seconds (FIG. 19C).
Figure 19B:
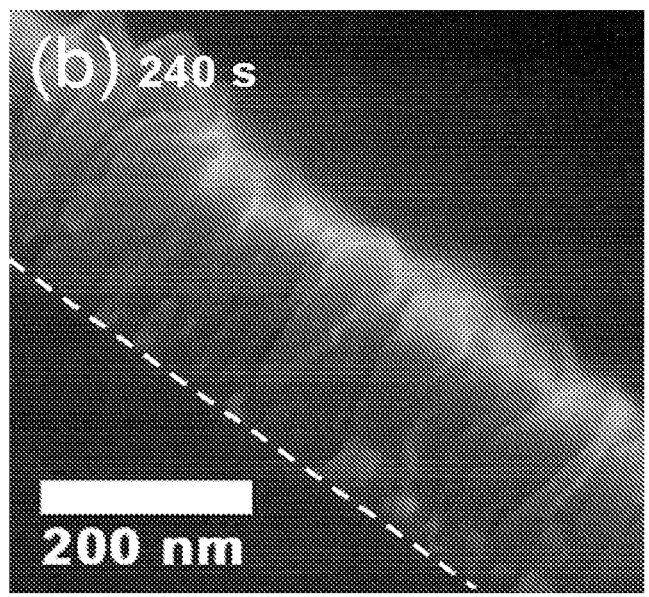
Figure 19C:
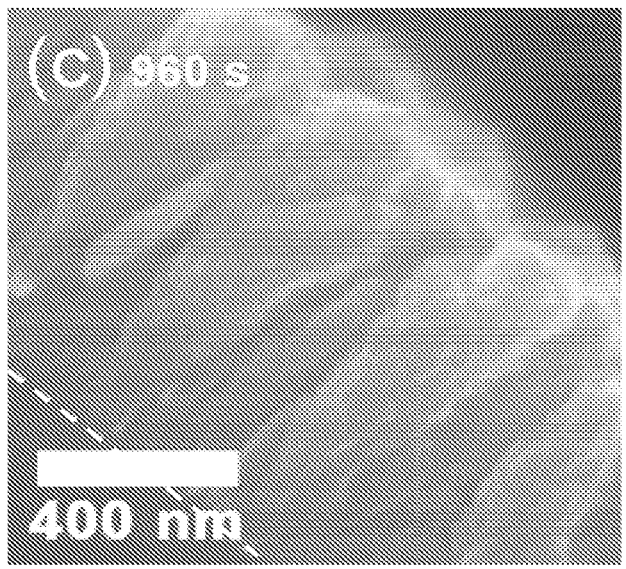
Figure 20:
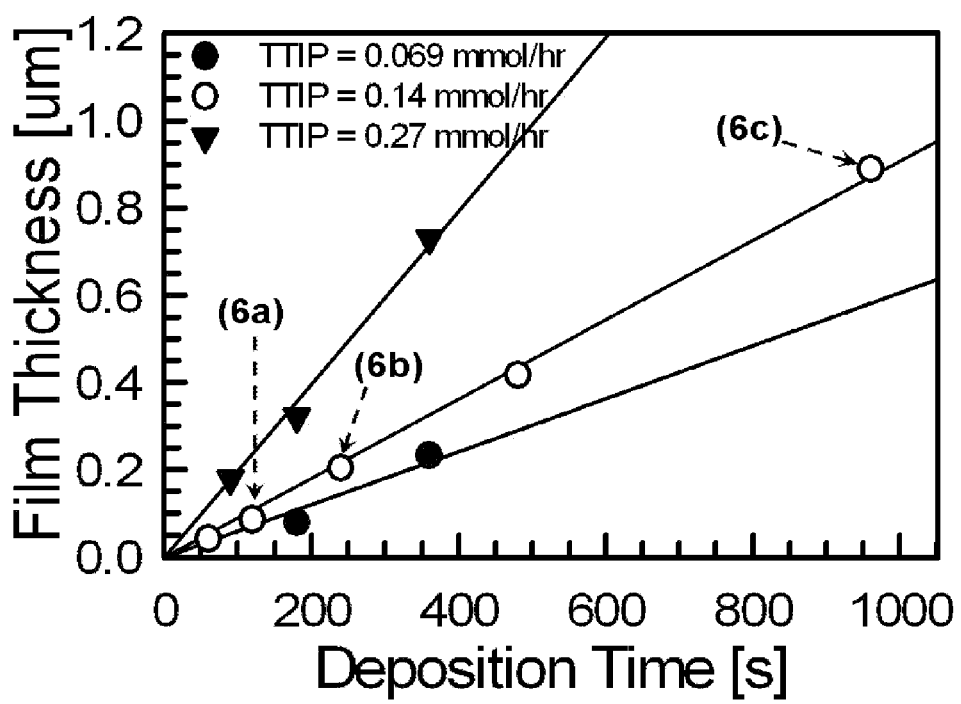
FIG. 20 is an illustration of titanium dioxide film thickness in nm versus deposition time for titanium isopropoxide metal precursor feed rates 0.069 millimols per hour, 0.14 millimols per hour, and 0.27 millimols per hour. The point labeled 6a corresponds to the film depicted in FIG. 19(a) (0.14 millimols per hour titanium isopropoxide metal precursor for 120 seconds); the point labeled 6b corresponds to the film depicted in FIG. 19(b) (0.14 millimols per hour titanium isopropoxide metal precursor for 240 seconds); and the point labeled 6c corresponds to the film depicted in FIG. 19(c) (0.14 millimols per hour titanium isopropoxide metal precursor for 960 seconds).

Film thicknesses were controlled by varying both the deposition time and TTIP feed rate. Films were deposited for different times and imaged by SEM to measure thickness. In FIG. 19, selected side view SEM images are shown that illustrate the evolution of film thickness for several deposition times at a fixed titanium isopropoxide metal precursor feed rate of 0.14 millimols per hour. Film (a) resulted from a 120 second deposition time, film (b) resulted from a 240 second deposition time, and film (c) resulted from a 960 second deposition time. As depicted in FIG. 20, film thickness increased roughly linearly with deposition time. In addition, the growth rate increased with TTIP feed rate in response to the increased mass flux to the substrate.

Figure 21:
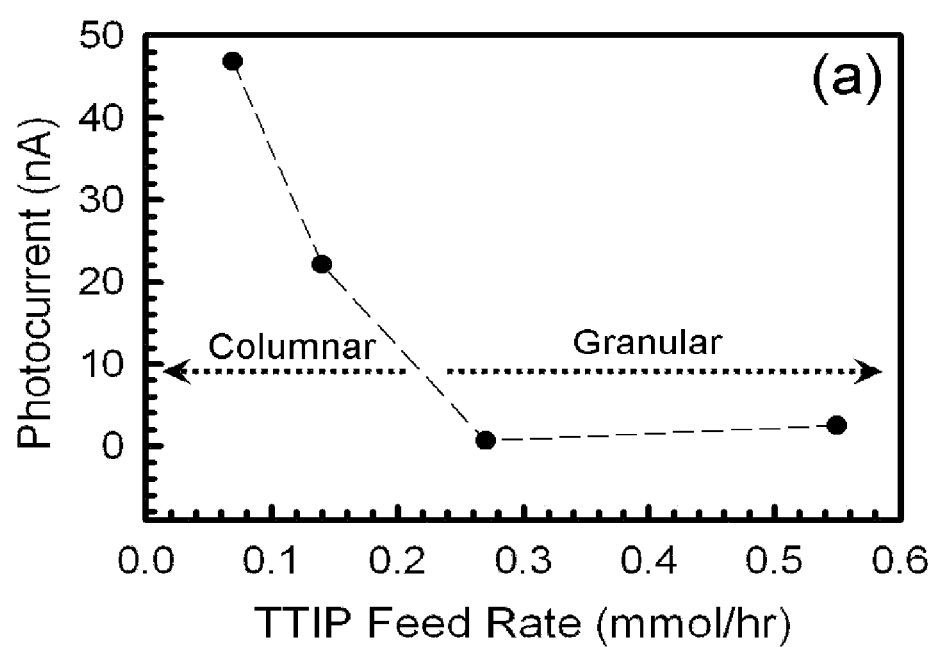
FIG. 21 is an illustration of photocurrent in nanoamperes for titanium dioxide films of the present invention prepared in a flame aerosol reactor for various titanium isopropoxide metal precursor feed rates at a fixed feed time of 180 seconds.
Figure 22:
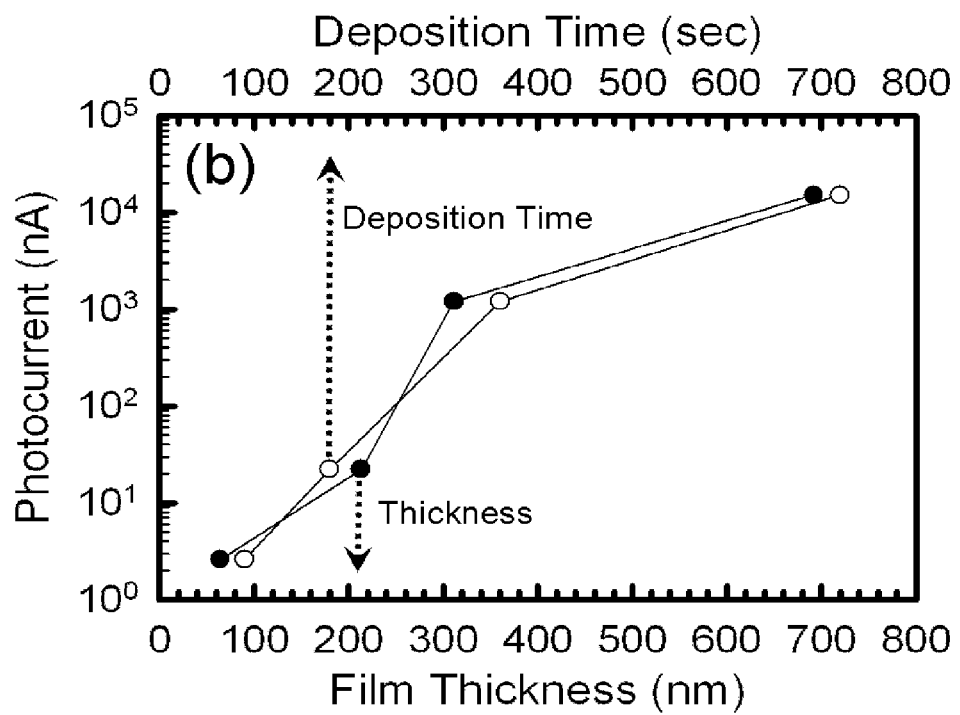
FIG. 22 is an illustration of photocurrent in nanoamperes for titanium dioxide films of the present invention having various film thicknesses in nm that were prepared in a flame aerosol reactor at a titanium isopropoxide metal precursor feed rate of 0.15 millimols per hour.

Films having selected film morphology and thickness for determination of the photoelectric properties were prepared by deposition onto electrically insulating high-temperature glass substrates (Borosilicate, ACE Glass, Vineland N.J.) at a slightly elevated temperature of 727° C. The photoelectric properties of the films were characterized by photocurrent measurements under UV irradiation from a 100 watt 360 nm lamp (Blak-Ray, Model B-1OOA). Photocurrent measurements of the films was performed to understand the relationship between film characteristics and photoactivity. An electrical circuit was created by connecting lead wires to the film and a DC power supply. The photocurrent was measured by applying a voltage of 22V to two silver electrodes (SPI supplies, West Chester Pa.) that were painted 1 cm apart on the film surface. The resulting current between the electrodes was measured using a picoammeter (Keithly Instruments, Cleveland Ohio). FIG. 21 and FIG. 22 depict photocurrent measurements that were taken for films deposited at several TTIP feed rates and deposition times where the photocurrent was at the noise level of the picoammeter when the uv lamp was switched off The data in Table 1 indicate that morphology had an effect on the photocurrent. The films deposited at lower TTIP feed rates exhibited greater photocurrents than the films formed with higher TTIP feed rates. At lower TTIP feed rates, the films had a sintered columnar like structure with a large grain size. At higher TTIP feed rates, the films had a particulate like structure with a small average grain size. The photocurrent is related grain size, but also depends on interfacial properties and can change for slight alterations of the film morphology. For instance, it is more difficult for free charge carriers to migrate to the electrodes in particulate films with small grain size because of particle-particle interfacial migration barriers (see Jongh P E and Vanmaekelbergh D., *Trap-Limited Electronic Transport in Assemblies of Nanometer-Sized $TiO_2$ Particles,* Phys. Rev. Lett 1996; 77:3427-3430). In continuous and well sintered films with larger grain size, free charge carriers encounter fewer migration barriers and can freely flow to the electrodes. This result is in agreement with other work that has found a higher electron drift mobility in columnar films, compared to granular particulate films (Aduda B O, Ravirajan P, Choy K L and Nelson J., *Effect of morphology on electron drift mobility in porous $TiO_2$,* International Journal of Photoenergy 2004; 6:141-147).

The photocurrent was larger for the thicker films (longer deposition times), while maintaining the well sintered, columnar morphology. As the thickness of the sintered columnar film was increased, it intercepted more light, thus generating an increased number of free charge carriers. The increased number of free charge carriers resulted in an increase in the measured photocurrent. The photocurrent measurements illustrate that the deposited films are photoactive and there are clear trends in the photoactivity as a function of controllable film characteristics.

Example 2

Figure 23:
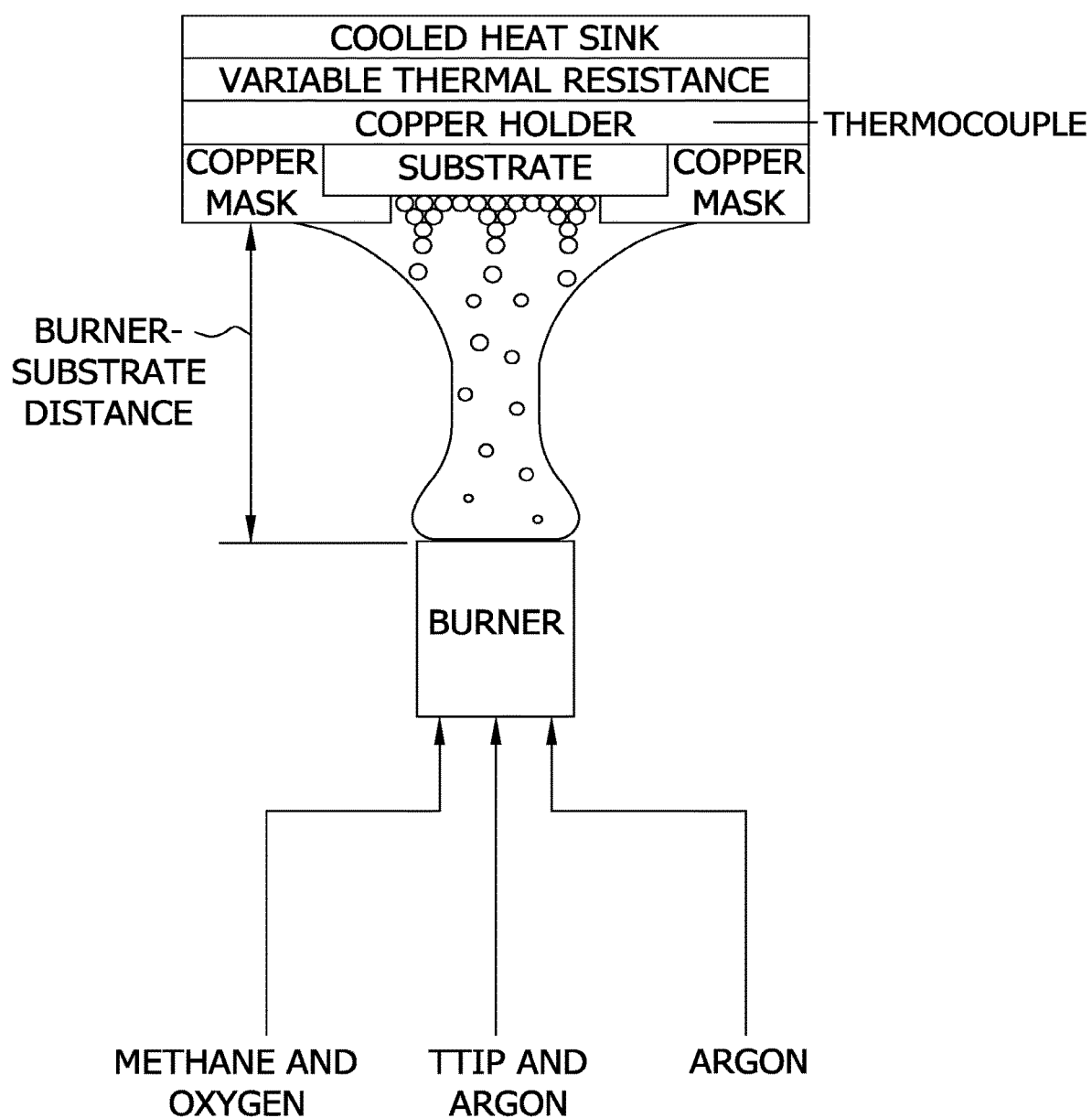
FIG. 23 is a schematic illustration of a second embodiment of a flame aerosol reactor of the present invention.

A FLAR was used to synthesize $TiO_2$ films with controlled morphology and thickness to evaluate the optoelectronic properties of watersplitting and photovoltaic performance. A FLAR was assembled comprising a precursor feed system, premixed methane-oxygen flame and a water-cooled deposition substrate (FIG. 23). The FLAR had digital mass flow controllers (MKS, Wilmington Mass.) to control the processes gases methane, oxygen, dilution-argon and carrier-argon. TTIP (Aldrich: 205273, 97% pure), was used to synthesize $TiO_2$ in the gas-phase. The precursor was delivered to the flame region by passing carrier-argon through a homemade bubbler that was maintained at 37° C. The carrier-argon flow rate was kept constant at 2.0 Lpm (at STP), which corresponded to a TTIP feed rate of approximately 1.2 mmol/hr, based on the vapor pressure of TTIP. The methane, oxygen and dilution-argon flow rates were kept constant at 0.9, 2.7 and 2.0 Lpm, respectively. All 4 process gasses were combined and sent through the burner to the flame region.

A soot-free flame was generated by combustion of methane and oxygen and was used to oxidize TTIP to form $TiO_2$ nanoparticles. The calculated adiabatic flame temperature was about 3027° C. A two-color pyrometer (Omega, iR2C-1000-53-C4EI) was used to measure the actual flame temperature. The reading fluctuated around the upper limit of the instrument at about 2727° C. In the flame, the TTIP rapidly reacted to form $TiO_2$ nanoparticles. Those nanoparticles underwent a collision process, as they transversed the flame, to reach a prescribed size upon arrival at the temperature-controlled substrate. Upon arriving at the substrate, the nanoparticles experienced a strong thermophoretic force, arising from the temperature gradient pointing from the hot flame to the cooler substrate, and were deposited out of the aerosol-phase onto the substrate.

The substrate was piece of aluminosilicate glass coated with 200 nm of indium tin oxide on one side (ITO, Delta Technologies, Stillwater Minn.), in intimate thermal contact with a copper substrate holder. Thermal contact was established between the ITO substrate and substrate holder by applying a small amount of silver thermal paste (Arctic Silver, Visalia Calif.). A type-K thermocouple is embedded in the holder about 0.33 cm (⅛ inch) behind the substrate, to estimate the substrate temperature. Due to resistance-induced temperature drops, the temperature measured at this location was system specific, and much lower than the actual surface temperature of the substrate. It was assumed that the temperature measured by the thermocouple linearly reflected the actual substrate temperature. Henceforth, the temperature measured by the thermocouple is referred to as the substrate temperature. Before introduction of TTIP into the flame, the substrate was allowed to heat up until the temperature stabilized. Once the temperature stabilized (about 5 minutes) the TTIP was introduced and film deposition commenced. During deposition, the substrate temperature fluctuated by less than 3° C. A copper mask was used to restrict the deposition (film) area to about 1 $cm^2$.

Two different film morphologies were produced by the FLAR. The first was a granular morphology, comprising nanoparticles caked onto the substrate, illustrated by the electron microscope images in FIG. 9. The second was a columnar morphology, comprising highly crystalline one dimensional (1D) structures oriented normal to the substrate, illustrated in FIG. 4. High resolution TEM analysis of single columns scraped off of the substrate showed that many of the columns are single crystal anatase.

The sintering behavior on the substrate was controlled by altering the arrival size of particles at the substrate and the substrate temperature. Those parameters were varied simultaneously though the burner-substrate distance. It is known that particle size increases with residence time in particle synthesis processes, which in this case changes with the burner-substrate distance (see Jingkun Jiang, Pratim Biswas and Da-Ren Chen, *Flame Synthesis of nanoparticles with rigorous control of their size, crystal structure and morphology for biological studies,* Nanotechnology, 18, pp. 8, (2007) and L. Mangolini, E. Thimsen and U. Kortshagen, *High-Yield Plasma Synthesis of Luminescent Silicon Nanocrystals,* Nanoletters, 5, pp. 655-659, (2005)). Additionally, the temperature distribution in premixed flames is a function of axial position and can be used to tune the substrate temperature. The particle size and substrate temperature were measured at two burner-substrate distances, 1.7 cm and 4.1 cm, respectively. The measured substrate temperature was 185° C. and 130° C. for 1.7 cm and 4.1 cm, respectively. The average particle size, measured from TEM images of particles extracted from the flame, was 3.1 nm and 3.9 nm at 1.7 cm and 4.1 cm, respectively. For shorter burner-substrate distances, smaller particles were deposited at a higher substrate temperature, resulting in rapid sintering dynamics on the substrate. At longer-burner substrate distances, slightly larger particles were deposited at a reduced substrate temperature, resulting in slower sintering dynamics. The distance was measured from the burner outlet to the substrate mask. Granular films were formed at longer burner-substrate distances, while columnar films are formed at shorter distances. This can be seen in FIG. 9 and FIG. 4, where micrographs are presented for films deposited at burner-substrate distances of 4.1 cm and 1.7 cm, respectively, while keeping all other parameters constant. At each burner-substrate distance, or morphology, the film thickness was systematically varied through the deposition time. The deposition time was varied from 0.5 to 17 minutes, which resulted in films with thicknesses in the range from 100 to 12,000 nm.

The films where characterized using SEM, TEM and XRD. Both SEM and TEM were used to characterize the film morphology. Side-view SEM images were used to estimate the film thickness. The crystalline phase (anatase vs. rutile) was verified using XRD and TEM. Both XRD and TEM were used to characterize the average crystalline grain size.

Watersplitting performance was determined using a conventional electrochemical cell (see J. Nowotny, C. C. Sorerell, L. R. Sheppard and T. Bak, *Solar-hydrogen: Environmentally safe fuel for the future,* International Journal of Hydrogen Energy, 30, pp. 521-544, (2005) The cell consisted of the $TiO_2$ film (working electrode) connected through an external circuit to a platinum wire (counter electrode), both electrodes immersed in a 1 M KOH aqueous electrolyte at a pH of 14. Using a DC power supply, an electric potential of 0.8 volts was applied between the $TiO_2$ film and platinum wire to enhance extraction of electrons from the film. The current through the external circuit was measured using an ammeter. The background current in the dark was about 30 μA. The $TiO_2$ films were illuminated by a 400 W Xe arc lamp, equipped with a water filter, at a light intensity of 24 mW/$cm^2$ at wavelengths below 400 nm ($TiO_2$ band gap), as measured by a spectroradiometer (International Light, Peabody Mass.). Upon illumination, hydrogen bubbles visibly formed on the platinum wire while oxygen formed on the $TiO_2$ film. Under illumination, the current through the external circuit was assumed proportional to the watersplitting hydrogen production rate. The photocurrent through the external circuit and power conversion efficiency were used as watersplitting performance metrics.

The watersplitting photocurrent was measured for columnar and granular films of varying thickness. As described above, columnar films were deposited at a burner-substrate distance of 1.7 cm with thicknesses in the rage from 100 to 3000 nm; while granular films were deposited at 4.1 cm in the thickness range 600 to 12000 nm. The watersplitting efficiency was estimated from the watersplitting photocurrent by performing an energy balance on the watersplitting cell. Energy entered the cell in the form of uv-light and electrical work, and left the cell in the form of hydrogen gas. The ratio of energy-output to energy-input was taken as the efficiency, using the following equation:

$$\eta = j_p E° H / (I_j j_p V_{app})$$

where $J_p$ is the measured photocurrent, $E°_H$ is the standard reduction potential of water formation from hydrogen and oxygen (1.23 V), $I_o$ is the incident light intensity (24 mW/cm$^2$) and $V_{app}$ is the applied voltage from the power supply (0.8 V). Both thickness and morphology had an effect on the watersplitting performance.

Photovoltaic performance was determined by constructing dye-sensitized solar cells using conventional procedures and components (see M. Gratzel, *Photoelectrochemical Cells,* Nature, 414, pp. pp.338-344, (2001). The TiO$_2$ films were sensitized to visible light by overnight soaking in an ethanol solution containing 3.3×10$^{-4}$ molar Ru-based dye (Ruthenium 535-bisTBA, Solaronix, Aubonne Switzerland). Counter electrodes were fabricated by sputter coating about 150 nm platinum films onto ITO substrates. A conventional acetonitrile based electrolyte (AN-50, Solaronix) using $I_3^-$/$I^-$ as the redox couple was used to transfer electrons from the platinum counter electrode to oxidized dye molecules on the TiO$_2$ surface. The two electrodes were sealed using approximately 8 layers of SX1170 sealant (Solaronix), resulting in approximately 0.48 mm separation between the electrodes. The cells were illuminated by a Xe arc lamp equipped with an AM1.5G filter at a total light intensity of about 124 mW/cm$^2$. The spectral distribution of light intensity was different from a AM1.5G solar standard. The spectral power density was as follows: UV (250 nm-400 nm)—18.5 mW/cm$^2$; visible (400 nm-700 nm)—26.4 mW/cm 2; IR (700 nm-1050 nm)—78.0 mW/cm$^2$. The light spectrum was more heavily weighted in the UV and IR, compared to AM1.5. It is known that the Ru-based dye is optimized for visible light and doesn't perform well in the UV and IR$^4$. The dye-sensitized cells presented in this work would likely perform much better under AM1.5 illumination. The standard performance metrics, open circuit voltage (V0 c), short-circuit current ($I_{sc}$), fill factor (FF) and conversion efficiency (η) were used to quantify the cell performance.

The photocurrent increased with thickness, until reaching a threshold value, and then decreased for thicker films. This behavior was observed for both morphologies. The threshold thickness represents the optimum balance between light absorption and transport losses. As the film thickness increases more light is absorbed. However, after a certain point the light gets entirely absorbed. An increase in thickness beyond the critical value simply increases the time it takes for charge-carriers to migrate through the film, making recombination processes competitive with transport. The photocurrent for films thinner than the threshold value is light-absorption limited, while thicker films are transport limited.

Figure 24:
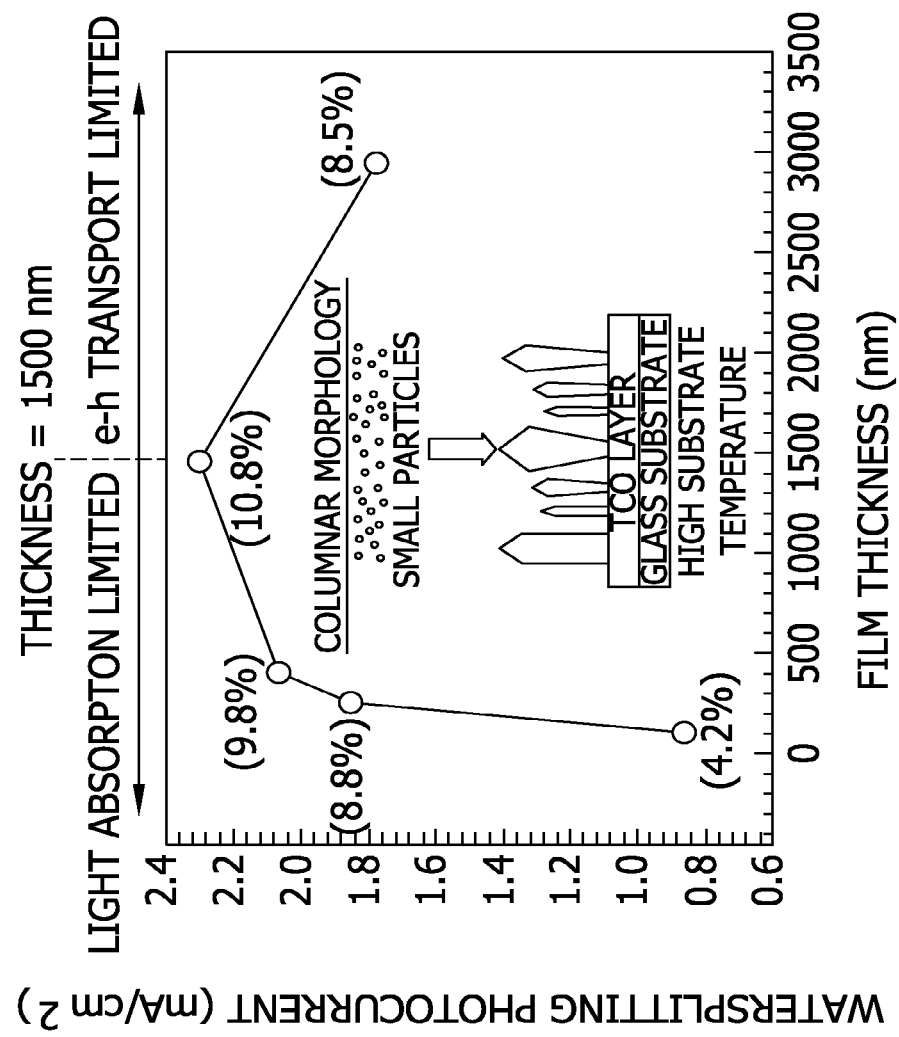
FIG. 24 is a schematic illustration of watersplitting performance in mA/cm$^2$ for various film thicknesses for columnar morphology films of the present invention wherein titanium dioxide was deposited onto a substrate at a burner to substrate distance of 1.7 cm.
Figure 25:
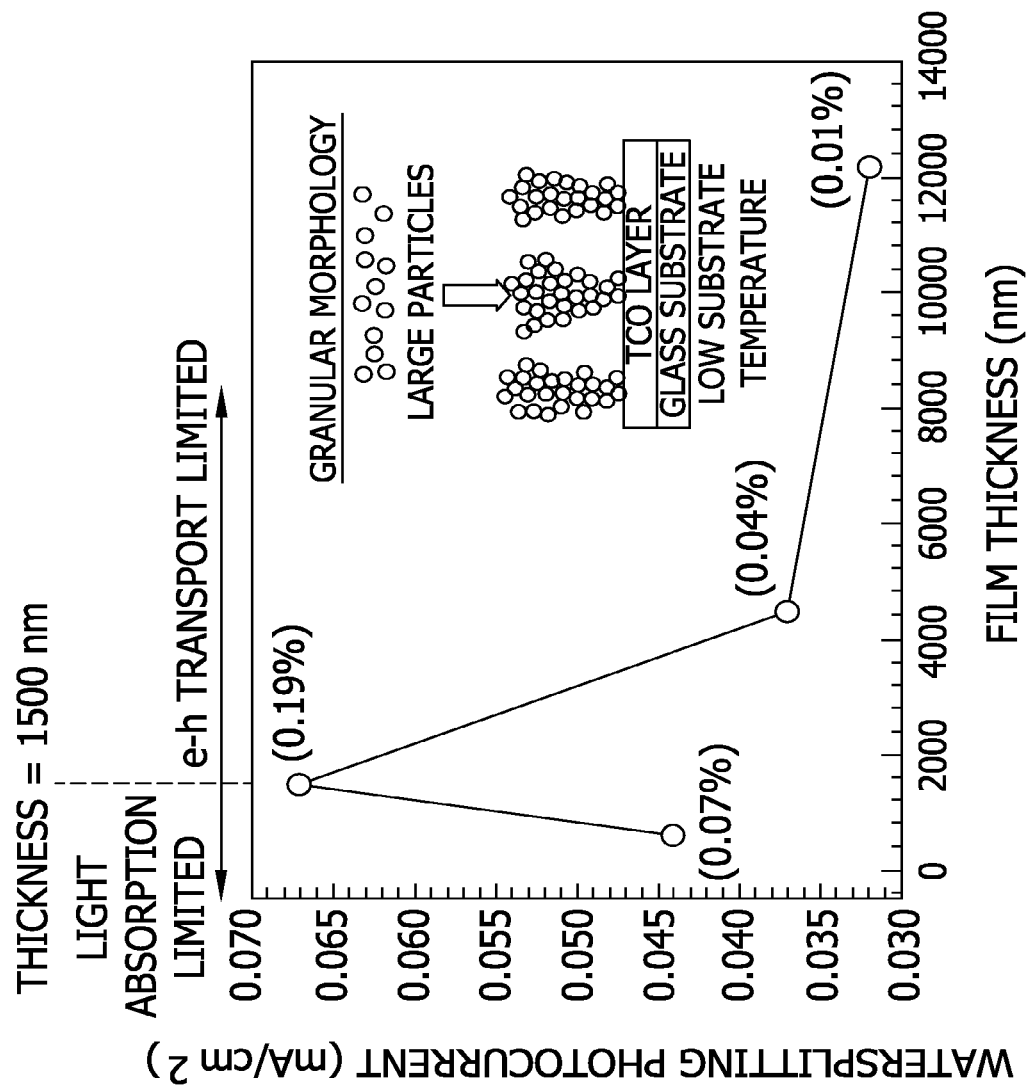
FIG. 25 is an illustration of watersplitting performance in mA/cm$^2$ for various film thicknesses for granular morphology films of the present invention wherein titanium dioxide was deposited onto a substrate at a burner to substrate distance of 4.1 cm.

Photocurrent was a function of film morphology. It can be seen from FIG. 24, columnar films deposited at 1.7 cm had 2 orders of magnitude higher photocurrents than granular films deposited at 4.1 cm (FIG. 25) reaching a uv-light to hydrogen conversion efficiency of about 11%. That efficiency is competitive with the best reported values in the literature (see M. Paulose, K. Shankar, S. Yoriya, H. E. Prakasam, O. K. Varghese, G. K. Mor, T. A. Latempa, A. Fitzgerald and C. A. Grimes, *Anodic growth of highly ordered TiO$_2$ nanotube arrays to* 134 mu m *in length,* J Phys Chem B, 110, pp. 16179-16184, (2006)). It is believed that the columnar films had higher photocurrents because of their superior electronic properties. For FLAR-produced TiO$_2$ films, the columnar morphology has also been found to have a higher photoconductivity, relative to the granular morphology (see Elijah Thimsen and Pratim Biswas, *Nanostructured FPhotoactive Films Synthesized by a Flame Aerosol Reactor,* AIChE J., 53, pp. 1727-1735, (2007) Also, it has been reported that particle-particle interfaces in granular films present migration barriers for electrons, increasing the time it takes for electrons to be transported in the film, making recombination competitive with transport (see P. E. de Jongh and D. Vanmaekelbergh, *Trap-Limited Electronic Transport in Assemblies of Nanometer-Sized TiO$_2$ Particles,* Phys. Rev. Lett, 77, pp. 3427-3430, (1996)). Additionally, it is known that for films produced by separate synthesis processes, electron drift velocities are higher in films with 1D morphologies than in granular films (see B. O. Aduda, P. Ravirajan, K. L. Choy and J. Nelson, *Effect of morphology on electron drift mobility in porous TiO$_2$,* Int J Photoenergy, 6, pp. 141-147, (2004)). However, other 1D morphologies, such as TiO$_2$ nanotubes, have been found to have similar transport characteristics to granular films. Despite the similar electron transport characteristics, TiO$_2$ nanotubes were found to have an order of magnitude longer recombination time relative to granular films (see K. Zhu, N. R. Neale, A. Miedaner and A. J. Frank, *Enhanced charge-collection efficiencies and light scattering in dye-sensitized solar cells using oriented TiO$_2$ nanotubes arrays,* Nano Lett, 7, pp. 69-74, (2007)). In some cases, it appears that 1D structures offer superior transport characteristics relative to granular morphologies, while in other cases they offer longer recombination times. When comparing granular to columnar films produced by the FLAR, it is not clear whether transport is enhanced, the recombination time is lengthened, or if it is a combination of both. However, it is reasonable to conclude that the highly crystalline 1D, columnar films have generally superior electronic properties to the granular films, resulting in higher photocurrents, and greatly improved watersplitting performance.

Dye-sensitized solar cells have different morphological requirements than watersplitting cells. In dye-sensitized solar cells, light is absorbed by dye molecules adsorbed onto the surface of the TiO$_2$. Surface area is important because the amount of dye adsorbed, which enhances light absorption, increases with TiO$_2$ surface area. The increased light absorption results in more electron injection into the TiO$_2$ film, which increases the current generated by the solar cell.

Solar cells were fabricated using the 2 different morphologies of TiO$_2$, granular deposited at a burner-substrate distance of 4.1 cm, and columnar deposited at 1.7 cm. Both films were approximately 3500 nm in thickness. Prior to cell construction, the amount of dye adsorbed onto each film was determined by uv-vis absorption measurements on dye desorbed from the films using a 1 mM KOH solution. The cells were constructed using the same procedure. The only variable was the titania film.

Figure 26:
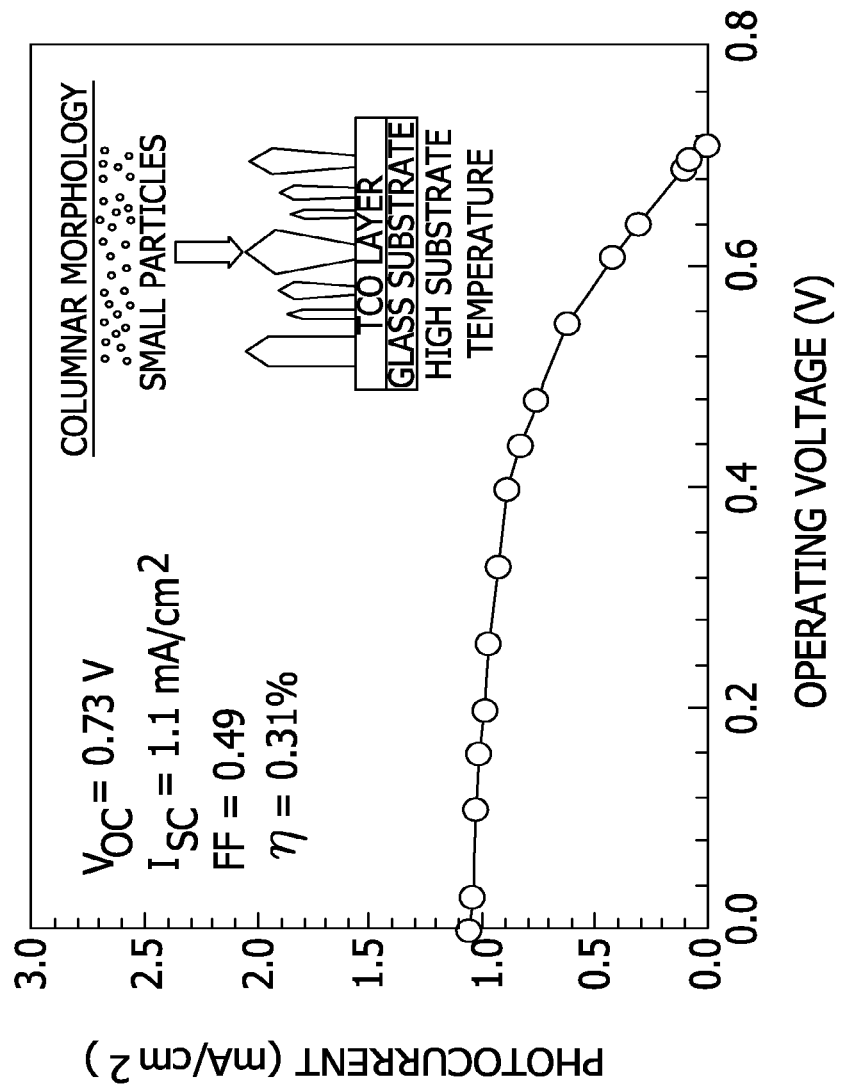
FIG. 26 is an illustration of photocurrent performance in mA/cm 2 for various film thicknesses for columnar morphology films of the present invention wherein titanium dioxide was deposited onto a substrate at a burner to substrate distance of 1.7 cm.
Figure 27:
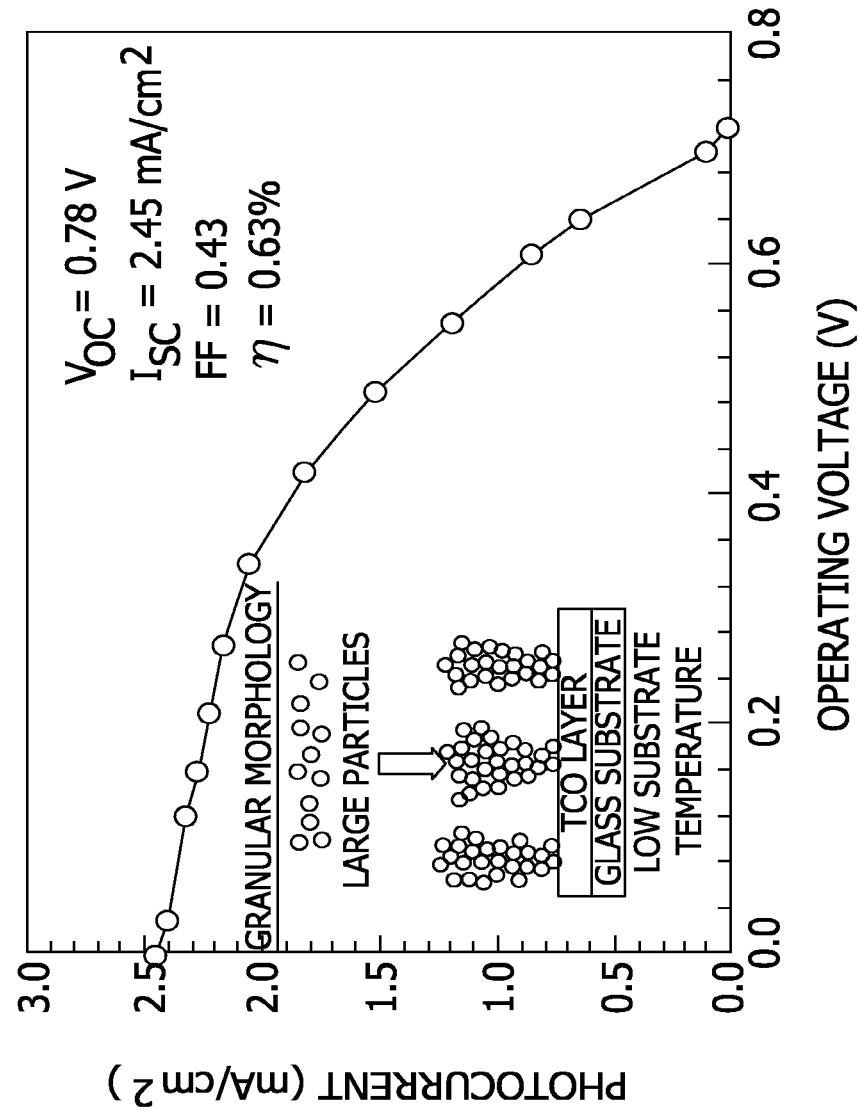
FIG. 27 is an illustration of photocurrent performance in mA/cm 2 for various film thicknesses for granular morphology films of the present invention wherein titanium dioxide was deposited onto a substrate at a burner to substrate distance of 4.1 cm.

The granular film has a conversion efficiency about 2 times higher than the columnar film. That result contrasts with the watersplitting measurements described above where the columnar film outperformed the granular film. The difference is likely due to the amount of dye adsorbed onto the TiO$_2$ film. It can be seen from FIG. 25 and FIG. 26 that the columnar film adsorbed approximately 50% more dye than the granular film. The greater amount of dye on the granular film resulted in more current generated by the cell which increased the conversion efficiency.

When introducing elements of the present invention or the preferred embodiments(s) thereof, the articles "a", "an", "the" and "said" are intended to mean that there are one or more of the elements. The terms "comprising", "including" and "having" are intended to be inclusive and mean that there may be additional elements other than the listed elements.

In view of the above, it will be seen that the several objects of the invention are achieved and other advantageous results attained.

As various changes could be made in the above compositions and processes without departing from the scope of the invention, it is intended that all matter contained in the above description and shown in the accompanying drawing[s] shall be interpreted as illustrative and not in a limiting sense.

What is claimed is:

1. A nanostructured photo-water splitting cell comprising:
a photoanode comprising a support and a nanostructured metal oxide film disposed on at least one surface of the support, wherein the nanostructured metal oxide film comprises metal oxide particles having an average particle size of less than about 20 nanometers, wherein the film predominantly comprises a columnar morphology characterized as having continuous individual columnar structures oriented approximately normal to the support wherein the columnar structures have an average width (w) and a crystal grain size ($X_s$), and wherein w/10 is greater than $X_s$, and
a cathode comprising a counter electrode.

2. The nanostructured photo-water splitting cell of claim 1 wherein the nanostructured metal oxide is titanium dioxide.

3. The nanostructured photo-water splitting cell of claim 1 wherein the film has a thickness of from about 10 nanometers to about 20 micrometers.

4. The nanostructured photo-water splitting cell of claim 1 wherein the nanostructure has a short range crystalline order of about 1 to about 50 nanometers.

5. The nanostructured photo-water splitting cell of claim 1 wherein the film comprises at least about 80% columnar structures.

6. The nanostructured photo-water splitting cell of claim 1 wherein the film comprises columnar structures having a central axis +/− about 20 degrees oriented normal to the support.

7. The nanostructured photo-water splitting cell of claim 1 wherein the average particle size is from about 3 nanometers to about 14 nanometers.

8. The nanostructured photo-water splitting cell of claim 1 wherein the film is synthesized in a flame aerosol reactor (FLAR).

* * * * *